(12) United States Patent
Simon et al.

(10) Patent No.: US 12,406,974 B1
(45) Date of Patent: Sep. 2, 2025

(54) OPTOELECTRONIC DEVICE INCLUDING A LIGHT-EMITTING DIODE STACKED ON A PHOTODETECTOR

(71) Applicant: COMMISSARIAT A L'ENERGIE ATOMIQUE ET AUX ENERGIES ALTERNATIVES, Paris (FR)

(72) Inventors: Julia Simon, Grenoble (FR); Clément Ballot, Grenoble (FR); Quentin Abadie, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 19/068,401

(22) Filed: Mar. 3, 2025

(30) Foreign Application Priority Data

Mar. 4, 2024 (FR) ...................................... 2402159

(51) Int. Cl.
*H01L 33/00* (2010.01)
*H01L 25/16* (2023.01)
(Continued)

(52) U.S. Cl.
CPC ........... *H01L 25/167* (2013.01); *H10F 55/18* (2025.01); *H10H 29/011* (2025.01);
(Continued)

(58) Field of Classification Search
CPC .... H10H 29/142; H10H 29/857; H10H 29/49; H10H 29/011; H01L 25/167; H10F 55/18
See application file for complete search history.

(56) References Cited

U.S. PATENT DOCUMENTS

| 10,734,439 B2 | 8/2020 | Templier et al. |
| 11,410,978 B2 | 8/2022 | Bono et al. |

(Continued)

FOREIGN PATENT DOCUMENTS

| EP | 4 092 746 A1 | 11/2022 |
| EP | 4 148 810 A1 | 3/2023 |

(Continued)

OTHER PUBLICATIONS

Preliminary Search Report & Written Opinion mailed Oct. 24, 2024, in corresponding French Patent Application No. 2402159 with English translation, 14 pages.

*Primary Examiner* — Ismail A Muse
(74) *Attorney, Agent, or Firm* — Oblon, McClelland, Maier & Neustadt, L.L.P.

(57) ABSTRACT

The invention relates to an optoelectronic device including a control circuit, a pixel comprising a photodetector, a light-emitting diode, and an intermediate region interposed between the photodetector and the light-emitting diode. The photodetector is sensitive to a detection wavelength $\lambda_2$. The light-emitting diode comprises an active stack with a cutoff wavelength Ac shorter than $\lambda_2$ and a buried electrode interposed between an interconnection stack of the circuit and the active stack, and covers a detection surface of the photodetector. The device furthermore comprises a via passing right through the active stack and extending as far as the interconnection stack; an electrical contact passing right through the active stack, in contact with the buried electrode; an electrical path electrically connecting the buried electrode to the control circuit and including the electrical through-contact and the via. The intermediate region is devoid of metal and the buried electrode is transparent to $\lambda_2$.

15 Claims, 12 Drawing Sheets

(51) Int. Cl.
*H10F 55/00* (2025.01)
*H10H 29/01* (2025.01)
*H10H 29/14* (2025.01)
*H10H 29/85* (2025.01)
*H10H 29/49* (2025.01)

(52) U.S. Cl.
CPC ........ *H10H 29/142* (2025.01); *H10H 29/857* (2025.01); *H10H 29/49* (2025.01)

(56) References Cited

U.S. PATENT DOCUMENTS

| | | |
|---|---|---|
| 11,444,118 B2 | 9/2022 | Bono et al. |
| 2017/0294467 A1* | 10/2017 | Tamiya ............... H10F 39/8057 |
| 2019/0355776 A1* | 11/2019 | Uchida .................. H04N 25/76 |
| 2022/0375914 A1 | 11/2022 | Becker |
| 2023/0064995 A1 | 3/2023 | Templier |
| 2023/0081818 A1 | 3/2023 | Templier et al. |

FOREIGN PATENT DOCUMENTS

| | | |
|---|---|---|
| FR | 3123152 A1 | 11/2022 |
| FR | 3123153 A1 | 11/2022 |

\* cited by examiner

OPTOELECTRONIC DEVICE INCLUDING A LIGHT-EMITTING DIODE STACKED ON A PHOTODETECTOR

CROSS REFERENCE TO RELATED APPLICATIONS

This application claims the priority benefit of French patent application number 24/02159, filed on Mar. 4, 2024, entitled "Optoelectronic device comprising a light-emitting diode stacked on a photodetector", which is hereby incorporated by reference to the maximum extent allowable by law.

TECHNICAL FIELD

The field of the invention is that of optoelectronic devices combining a function of emitting light and of detecting a light flow. The invention relates for example to an interactive display screen comprising a matrix sensor and a matrix of light-emitting diodes controlled by a control circuit. The invention also relates to a method for manufacturing such a device.

PRIOR ART

Display screens have benefited from technological advances in the field of light-emitting diodes for illumination. Thus there are for example screens of all dimensions implementing light-emitting diodes based on gallium nitride (GaN). Among these, microscreens generally comprise a large number of light-emitting diodes with dimensions typically less than 10 μm, disposed in a matrix. Each light-emitting diode constitutes a pixel of the microscreen. Microscreens based on gallium nitride (GaN) have high luminance and good resolution, are compact and generally consume little electric current.

Recently, new screens, referred to as interactive screens, have appeared. One category of interactive screen combines a matrix of light-emitting diodes with a matrix photon sensor, both supplied and controlled by a control circuit. These make it possible to address new applications requiring a response from the interactive screen itself and/or from a system in which the interactive screen is integrated, according to a light flow detected and/or measured by the matrix sensor. The matrix photon sensor is an optoelectronic component including a plurality of photodetectors disposed in a matrix. When each photodetector of the photon sensor is arranged facing a respective light-emitting diode, the interactive screen is compact and has good resolution.

The patent application EP4148810 is such an example of an interactive screen based on GaN light-emitting diodes. In this document, an integrated circuit includes a first substrate and a plurality of interconnection levels on the first substrate. The first substrate furthermore incorporates a photon sensor including a matrix of photodiodes. A matrix of light-emitting diodes is implemented on a second substrate from epitaxed layers based on AlInGaN and/or InGaN and/or AlGaN and/or GaN. The light-emitting diodes are separated from one another by grids made from conductive material, each electrically insulated from the light-emitting diode. These are therefore individualised.

The first and second substrates include respectively first metal bonding pads and second metal bonding pads lying flush respectively with a face of a first dielectric layer and a face of a second dielectric layer. A second substrate is transferred onto the first substrate by hybrid direct bonding of the first and second bonding pads and first and second dielectric layers. For this purpose a degree of occupation of the first and second bonding pads is between 60% and 90% on each of the faces. The end of this step, each light-emitting diode, previously individualized before the transfer, is disposed facing a photodiode and separated therefrom by a first bonding pad bonded to a second bonding pad, itself in contact with a second electrode of the light-emitting diode. The second electrode is metal and reflective. An assembly consisting of a first interconnection pad, a second interconnection pad and a second electrode constitutes an individual buried electrode of the light-emitting diode. Each buried electrode is an anode electrode of an individual light-emitting diode. The light-emitting diodes have a common cathode made from indium-tin oxide (ITO).

In this configuration, the photodiode receives an incident light flow on a part of a detection surface that is not located vertically in line with the buried electrode, the incident light flow being possibly originating from the facing light-emitting diode or from an external scene. Consequently, the photodiode receives only part of the incident light flow, that which is not obturated by the buried electrode. The part of the incident light flow is for example received through a hole formed in the second electrode, concentric with wider holes formed in the first and second bonding pads. An increase in the surface area of the second electrode causes an increase in the quantum efficiency of the light-emitting diode, to the detriment of the quantity of flow reaching the photodiode.

The result is a compromise between sensitivity of the photon sensor and efficiency of emission of the matrix of light-emitting diodes.

DESCRIPTION OF THE INVENTION

The objective of the invention is to at least partly remedy the drawbacks of the prior art, and more particularly to propose an optoelectronic device including a light-emitting diode superimposed on a photodetector with increased sensitivity to an incident light flow, without compromising the emission efficiency of the light-emitting diode. The optoelectronic device of the invention is particularly advantageous for use in a system of the laboratory-on-chip type.

For this purpose, the object of the invention is an optoelectronic device comprising a substrate; a control circuit integrated in and/or on the substrate comprising an interconnection stack; a matrix of at least one pixel. Each pixel comprises a photodetector, a light-emitting diode, and an intermediate region interposed between the photodetector and the light-emitting diode. Each pixel is such that the photodetector is sensitive to a detection wavelength $\lambda_2$ and comprises a detection surface extending in a plane substantially parallel to a main plane of the substrate. The light-emitting diode comprises an active stack with a cutoff wavelength Ac shorter than the detection wavelength $\lambda_2$. The active stack comprises first and second doped layers of opposite types. The light-emitting diode furthermore comprises a buried electrode in contact with the second doped layer. The light-emitting diode is arranged so that the buried electrode is interposed between the interconnection stack and the active stack, and covers the detection surface. Each pixel is such that the intermediate region is delimited by the detection surface and extends from the detection surface as far as the active stack. The optoelectronic device furthermore comprises a via passing entirely through the active stack and extending up to an interconnection level of the interconnection stack; an electrical contact passing entirely through the active stack, in contact with the buried electrode;

an electrical path electrically connecting the buried electrode to the control circuit and comprising the electrical through-contact and the via. The intermediate region is devoid of metal, and the buried electrode is transparent to the detection wavelength $\lambda_2$.

Some preferred but non-limitative aspects of this optoelectronic device are as follows.

The optoelectronic device can be such that, for each pixel, the light-emitting diode can comprise an active region extending between the first and second doped layers in a plane substantially parallel to the main plane; a conductive trench can surround the active region and the intermediate region, can pass entirely through the active stack and can extend up to an interconnection level of the interconnection stack; and a surface electrode in contact with the first doped layer, electrically connected to the control circuit by the conductive trench.

The optoelectronic device can be such that the conductive trench is coated with a mirror.

The matrix can comprise a plurality of pixels, and the surface electrode can be an electrode common to all the pixels.

The conductive trenches of two adjacent pixels can have a part in common.

The intermediate region can comprise an intermediate layer with an optical function that can extend parallel to the main plane of the substrate.

For each pixel, the buried electrode can be made from an indium-tin oxide, from a zinc oxide doped with aluminum, or from tin dioxide.

For each pixel, the surface electrode can be made from an indium-tin oxide, or from a zinc oxide doped with aluminum.

The optoelectronic device can furthermore comprise a surface layer with an optical function disposed on a face of the optoelectronic device opposite to the substrate.

The surface layer with an optical function can be an absorbing layer comprising an opening facing the detection surface.

The optoelectronic device can further comprise a heating element arranged on a face of the optoelectronic device opposite to the substrate, the heating element can comprise an opening facing the detection surface.

The detection wavelength $\lambda_2$ can belong to a visible spectrum and the light-emitting diode can be capable of emitting a light flow in the UVA range.

The invention also relates to a method for manufacturing an optoelectronic device comprising a light-emitting diode and a photodetector sensitive to a detection wavelength $\lambda_2$. The method comprises providing a first assembly comprising, in the following order, a first substrate, a semiconductor stack, and a lower conductive layer, such that the semiconductor stack comprises a first doped layer of a first type of conductivity and a second doped layer of a second type of conductivity opposite to the first type of conductivity, interposed between the first doped layer and a substrate, and such that the lower conductive layer is in physical contact with the second doped layer.

The method comprises providing of a second assembly comprising a second substrate, a control circuit, and the photodetector, such that the control circuit is integrated in and/or on the second substrate and comprises an interconnection stack.

The method comprises bringing a face of the first assembly opposite to the first substrate onto a face of the second assembly opposite to the second substrate by direct bonding implementing a bonding layer transparent to the detection wavelength $\lambda_2$.

The method comprises exposing the first doped layer including removing of the first substrate, to obtain an active stack comprising the first doped layer and the second doped layer.

The method comprises etching a first hole implementing an alignment of the first hole with respect to an element of the second assembly, so that the first hole passes entirely through the active stack and extends up to an interconnection level of the interconnection stack.

The method comprises etching a second hole implementing an alignment of the second hole with respect to an element of the second assembly, so that the second hole passes entirely through the active stack with stoppage on the lower conductive layer.

The method comprises passivating the first hole and the second hole to obtain, respectively, a first passivated hole and a second passivated hole.

The method comprises filling the first and the second passivated holes with a metal to obtain, respectively, a via and an electrical contact.

The method comprises forming a conductive line electrically insulated from the active stack and in contact with the electrical contact and the via.

The method comprises forming an active region of the light-emitting diode in the active stack facing a detection surface of the photodetector, after the bonding step, implementing an alignment of the active region with respect to an element of the second assembly.

The step of forming the active region can comprise a substep of etching a trench that can pass entirely through the active stack and that can extend up to an interconnection level of the interconnection stack.

The bonding layer can comprise an intermediate layer with an optical function.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings wherein.

DETAILED DESCRIPTION OF PARTICULAR EMBODIMENTS

Figure 1A:
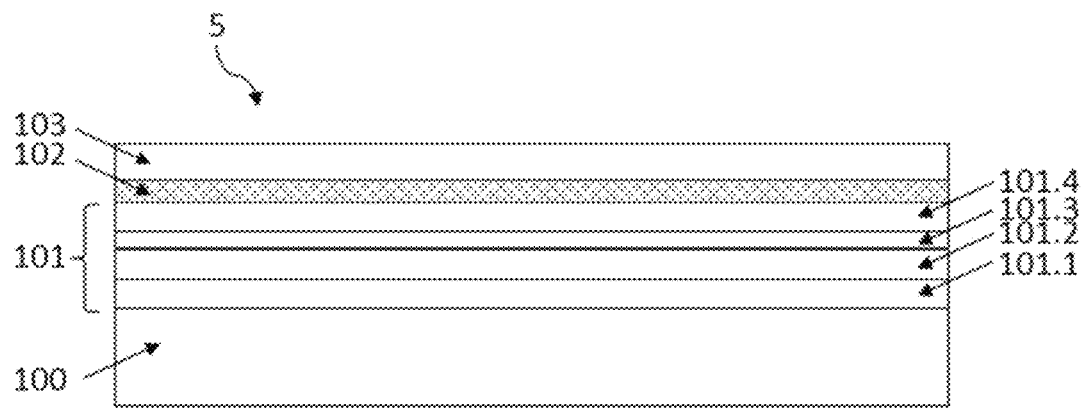
FIG. 1A is a schematic view in cross section of a first assembly comprising a semiconductor stack on a first substrate.

In the figures and in the following description, the same references represent identical or similar elements. In addition, the various elements are not plotted to scale so as to favor clarity of the figures. Moreover, the various embodiments and variants are not exclusive of one another and can be combined together. Unless stated otherwise, the terms "substantially", "about", "of the order of" mean within a 10% margin, and preferably within a 5% margin. Moreover, the terms "included between . . . and . . ." and the like mean that the bounds are included, unless stated otherwise.

The invention relates to an optoelectronic device including a substrate, a control circuit integrated in and/or on the substrate which comprises an interconnection stack, a light-emitting diode, and a photodetector. The light-emitting diode is superimposed on the photodetector and supplied and/or controlled by the control circuit. The photodetector is arranged and configured to detect a light flow, referred to as incident, at a detection wavelength $\lambda_2$, passing through the light-emitting diodes to reach a detection surface of the photodetector. This is in particular possible because the light-emitting diode includes a semiconductor stack with a cutoff wavelength Ac shorter than the detection wavelength $\lambda_2$. It therefore emits a so-called emitted light flow at an emission wavelength $\lambda_1$ shorter than the detection wavelength $\lambda_2$.

The light-emitting diode includes a stack of semiconductor layers and a buried electrode arranged between the stack of semiconductor layers and the detection surface.

The buried electrode is transparent to the wavelength $\lambda_2$ and is not in physical contact with an interconnection level of the interconnection stack. It is electrically connected to an interconnection level of the interconnection stack by an electrical path that includes an electrical contact, a via and a conductive line covering a face of the stack of semiconductor layers opposite to the buried electrode. The electrical path may also be more complex and comprise a set of electrical interconnections electrically connected to the electrical contact and to the via, and covering the face of the stack of semiconductor layers opposite to the buried electrode. The electrical contact and the via both pass right through the stack of semiconductor layers. The electrical contact is in physical contact on an upper part of the buried electrode opposite to the interconnection stack. The via is extended as far as an interconnection level of the interconnection stack. Thus an increase in the detection surface of the photodetector causes an increase in the incident light flow detected without having to reduce lateral dimensions of the buried electrode. In other words, the sensitivity of the photodetector is increased without loss of emission efficiency of the light-emitting diode.

The invention also relates to a method for manufacturing such an optoelectronic device. It comprises transferring a first assembly onto a second assembly. The first assembly includes, in the following order, a first substrate, a semiconductor stack and a conductive layer. The second assembly includes a second substrate, a control circuit, and a photodetector. The control circuit is integrated in and/or on the second substrate and comprises an interconnection stack. The conductive layer is transparent to the detection wavelength $\lambda_2$ of the photodetector. It is interposed between the semiconductor stack and the photodetector after the transfer.

The method includes a step, subsequent to the transfer, of forming an active region of the light-emitting diode in the semiconductor stack, by alignment on an element of the second assembly, in order to position the active region facing the photodetector. The method furthermore comprises a step, subsequent to the transfer, of forming a via and a conductive trench passing right through the semiconductor stack and extending as far as respective bonding pads of the interconnection stack. The via and the trench are intended to electrically connect the light-emitting diode to the control circuit. Forming the via and the conductive trench uses an alignment on an element of the second assembly. Thus the alignments, firstly of the active region of the light-emitting diode with respect to the photodetector and secondly of the via and conductive trench with respect to the bonding pads, are precise. Consequently a useful detection surface of the photodetector is increased, all the more so since it is possible to provide bonding pads of reduced sizes. The sensitivity of the photodetector is therefore increased.

The detection surface of a photodetector delimits the smallest planar surface of the photodetector through which all the photons of an incident light flow capable of generating a signal detected by a readout circuit of the photodetector.

An active region of an optoelectronic device is a part of the device intended to emit or detect light radiation of interest. The active region of a light-emitting diode is the region or regions inside which the charge carriers coming from electrodes of the light-emitting diode combine to produce photons. The active region of a photodiode is the region (or regions) inside which a photon is capable of generating a signal detected by a readout circuit of the photodiode.

In the description, "metal" is given its meaning normally used in the technical field of the invention. For reasons of clarity, it is however stated that metal oxides such as indium-tin oxide (ITO), aluminum-doped zinc oxide (AZO) or tin dioxide ($SnO_2$) are not metals.

In the description, "interconnection stack" is given its meaning normally used in the technical field of the invention. For reasons of clarity, it is however stated that an interconnection stack comprises layers called "interconnection levels", separated in pairs by layers called "interlevel layers". The interconnection levels include metal lines separated by an electrically insulating material. The interlevel layers include metal vias electrically connecting a metal line of one interconnection level to another metal line of an adjoining interconnection level or to a substrate on which the interconnection stack rests. The vias are separated by an electrically insulating material.

Layer means here, and for the remainder of the description, an extent consisting of one or more sublayers of a material, the thickness of which along an axis z is less, for example ten times or even twenty times, than its longitudinal width and length dimensions in a plane (x, y) perpendicular to the axis z. A layer may be structured. When it consists of a plurality of sublayers, the sublayers may be made from different materials. The sublayer or sublayers extend in planes substantially parallel to the plane (x, y). A conforming layer is a specific category of layer formed in contact with a non-planar surface, for which the thickness, measured perpendicularly to the surface, is substantially constant, for example to within 10%, or even to within 5%.

The cutoff wavelength $\lambda_c$ of a semiconductor material is the maximum wavelength of an incident photon that can be absorbed to excite an electron from the valence band to the conduction band of the semiconductor material, thus creating a free electron and a hole. This absorption occurs when the energy of the incident photon is equal to or greater than the energy of the forbidden band of the semiconductor material, also known by the term forbidden band or gap energy. The cutoff wavelength $\lambda_c$ of a semiconductor stack is equal to the minimum value of the cutoff wavelengths of all the semiconductor materials that constitute the semiconductor stack.

A first element is aligned with respect to a second element if the formation of the first element involves a photolithography substep implementing a location of the second element followed by a process of alignment on the basis of this location. The second element may be a set of typical alignment marks used by photolithography tools. The alignment is said to be first order, or primary, when the formation of the first element implements the photolithography substep. The alignment is said to be second order, or secondary, when the photolithography substep forms part of a step of forming an intermediate element on which the first element is aligned to first order. It is said to be of higher order when it is neither primary nor secondary. A primary alignment is more precise than a secondary alignment, i.e. the relative position of the first element with respect to the second element and with respect to any other element formed at the same time as the second element is more precise with a primary alignment than with a secondary alignment. A secondary-order alignment is more precise than a higher-order alignment. The first element may be a mask obtained by a supplementary photolithography step. It is then said that the supplementary photolithography step is aligned with respect to the second element.

Particular embodiments will be described in relation to an optoelectronic device including a light-emitting diode superimposed on a photodetector. However, these embodiments can be adapted to other optoelectronic devices, for example to a multispectral sensor including a supplementary photodetector in place of the light-emitting diode.

A first manufacturing method leading to a first embodiment is described below in relation to FIGS. 2A to 2J.

Figure 1B:
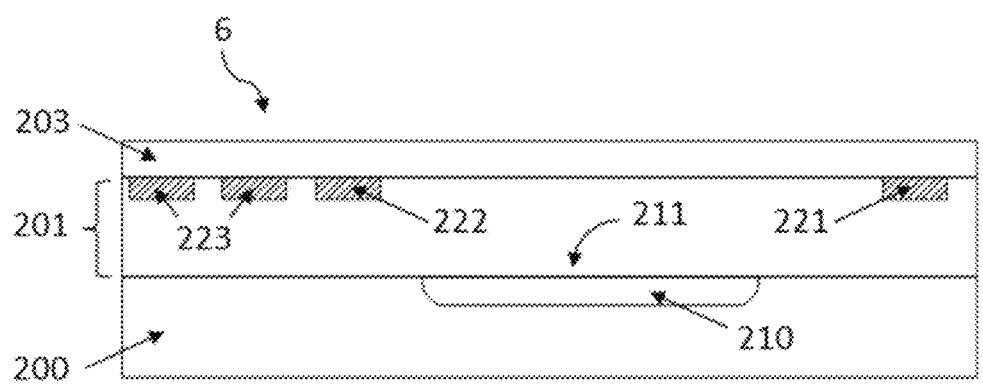
FIG. 1B is a schematic view in cross section of a second assembly comprising a second substrate, a control circuit, and a photodetector.
Figure 2A:
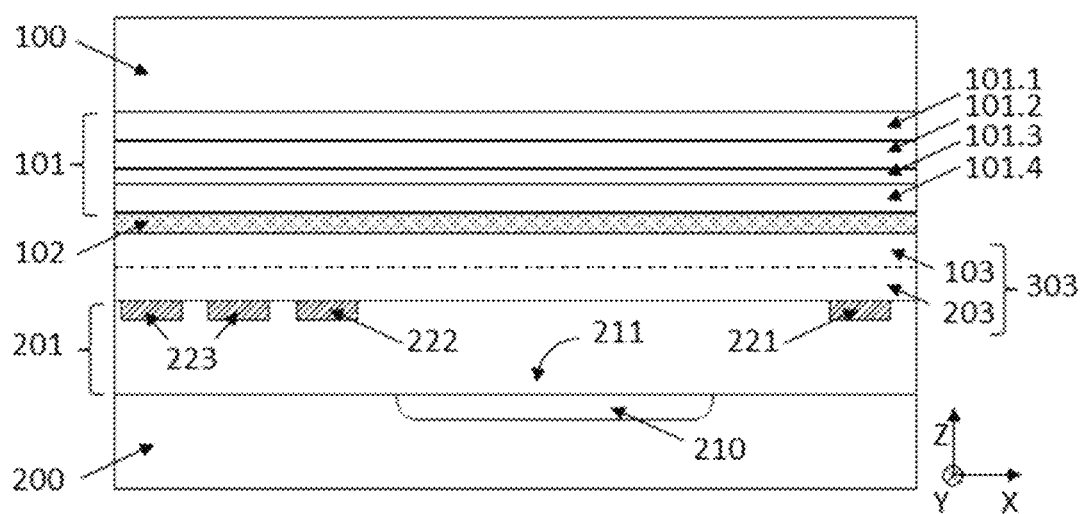
FIGS. 2A to 2H are schematic views in cross section of intermediate steps of a first method for manufacturing a first optoelectronic device according to the invention.

In FIG. 2A, a first assembly is transferred onto a second assembly. The first and second assemblies are respectively shown on the cross-sectional views in FIGS. 1A and 1B. The first and second assemblies may for example each be supplied, in whole or in part, by a semiconductor foundry company.

The first assembly 5 includes, in the following order, a first substrate 100, a semiconductor stack 101, a lower conductive layer 102, and a upper bonding layer 103. The semiconductor stack 101 is in physical contact with the first substrate 100 and the lower conductive layer 102. The upper bonding layer 103 is in physical contact with the lower conductive layer 102.

The semiconductor stack 101 is a stack of semiconductor layers. It includes a first doped layer 101.2 of a first conductivity type and a second doped layer 101.4 of a second conductivity type opposite to the first conductivity type. The first doped layer 101.2 is interposed between the second doped layer 101.4 and the first substrate 100. The semiconductor stack 101 can be grown by epitaxy on the first substrate 100. Where applicable, it can comprise a buffer layer 101.1 used for adapting a mesh parameter of the first doped layer 101.2 with a mesh parameter of the first substrate 100.

Alternatively, the semiconductor stack 101 can be grown by epitaxy on a temporary substrate and transferred onto the first substrate 100, for example by direct bonding of the first doped layer 101.2 on a face of the first substrate 100. For example, a p-doped layer is epitaxed on the temporary layer intended to become the second doped layer 101.4 of the semiconductor stack 101; an intrinsic layer is epitaxed on the p-doped layer; and an n-doped layer is epitaxed on the intrinsic layer intended to become the first doped layer 101.2 of the semiconductor stack 101. Where applicable, the semiconductor stack 101 can comprise a buffer layer 101.1, in contact with the first doped layer 101.2 and the first substrate 100, serving as a bonding layer. It may for example be a case of an oxide-oxide, or silicon-silicon, or silicon nitride-silicon nitride bonding. The bonding layer may include a bonding interface. This alternative is for example favored for obtaining a first doped layer 101.2 of gallium nitride (GaN) of type p.

The semiconductor stack 101 comprises a direct-gap crystalline semiconductor material, the energy value of which is capable of enabling the emission of a light flow at an emission wavelength $\lambda_1$.

The first and second doped layers 101.2, 101.4 are made from semiconductor materials. The semiconductor stack 101 can comprise a semiconductor active layer 101.3, interposed between the first doped layer 101.2 and the second doped layer 101.4, and in physical contact with these two layers. The active layer 101.3 can for example comprise a plurality of semiconductor sublayers with different energies to produce quantum wells. It can be not-intentionally doped or lightly doped of type p or n.

The first and second doped layers 101.2, 101.4 and the active layer 101.3 can for example be made from semiconductor materials selected from gallium nitride, gallium phosphide, gallium arsenide, and indium phosphide.

In the particular non-limitative context of the example of a method described below, the first doped layer 101.2 is an n-doped layer of gallium nitride (GaN). The second doped layer 101.4 is a p-doped layer of gallium nitride (GaN). The first substrate 100 is made from silicon, for example a silicon wafer 150 mm, 200 mm or 300 mm in diameter. The buffer layer 101.1 includes a sublayer of aluminum nitride (AlN) in physical contact with the first substrate 100 and a succession of GaN/AlGaN bilayers, the sublayers of AlGaN having concentrations of aluminum that are smaller, the further away they are from the first substrate 100. The active layer 101.3 includes quantum wells based on AlGaN, the composition of which is adapted for emitting light in the UVA range.

For reasons of clarity, certain elements in the description are qualified by their intended function resulting from the particular selection of doping types of the layers. This qualification must in no case be interpreted as a limitation.

Thus, for example, a cathode trench may accommodate a conductive trench connecting the cathode of the light-emitting diode, in the particular case described below, or the anode of the light-emitting diode if the first doped layer 101.2 and the second doped layer 101.4 are respectively doped of a p type and of an n type.

The second assembly 6 includes a second substrate 200, a control circuit, and a photodetector 210. The second substrate 200 is for example made from silicon. It advantageously has dimensions identical to the first substrate 100. For example, the first and second substrates may both be wafers of 150 mm, 200 mm or 300 mm. The control circuit is integrated on a so-called front face of the second substrate 200 and optionally in the second substrate 200. It may be of the CMOS type. It includes an interconnection stack 201 resting on a front face of the second substrate 200, for example in contact with the front face.

The interconnection stack 201 includes at least one interconnection level. The interconnection stack 201 here comprises an anode bonding pad 221 and a cathode bonding pad 222 both arranged in an interconnection level of the interconnection stack 201. The anode and cathode bonding pads 221, 222 are made from metal, for example from copper. In this example, the interconnection level including the anode and cathode bonding pads 221, 222 is the last interconnection level of the interconnection stack 201, i.e. the furthest away from the second substrate 200. Advantageously, the interconnection stack 201 can comprise a passivation layer made from a dielectric material, for example from silicon nitride (SiN), including a face of the interconnection stack 201 opposite to the second substrate 200. In this case, the control circuit and/or the photodetector 210 are preferentially not tested before the transfer step of FIG. 2A.

The second assembly 6 furthermore includes a lower bonding layer 203 resting on the interconnection stack 201 on a side of the interconnection stack 201 opposite to the second substrate 200. The lower bonding layer 203 can be the passivation layer of the interconnection stack 201 or a supplementary layer deposited on the passivation layer, advantageously previously polished.

The photodetector 210 comprises a detection surface 211 substantially parallel to the front face of the second substrate 200. Preferably, the detection surface 211 is facing a region of the interconnection stack 201 devoid of metal, i.e. the interconnection stack 201 does not have metal lines or vias vertically above the detection surface. The detection surface is here in the vicinity of the front face of the second substrate 200.

The photodetector 210 is sensitive to a detection wavelength $\lambda_2$, for example lying in the visible or near infrared spectrum, for example equal to 630 nm. Furthermore, it can also be sensitive to the emission wavelength $\lambda_1$. The control circuit is electrically connected to the photodetector 210 and incorporates functions of supplying the photodetector 210 and of reading charges generated in the photodetector 210.

The second assembly 6 can include a plurality of photodetectors 210, for example disposed in a matrix extending parallel to the front face of the second substrate 200. The interconnection stack 201 can furthermore comprise one or more supplementary bonding pads 223, for example disposed at the rim of the matrix of photodetectors 210. In FIG. 1B, two supplementary bonding pads 223 are shown in the same interconnection level as the anode and cathode bonding pads 221, 222. The supplementary bonding pads 223, if such exist, and the anode and cathode bonding pads 221, 222 are hereinafter collectively called the bonding pads 221, 222, 223.

The second assembly 6 can for example, as shown here, be a front side illumination (FSI) image sensor. It may also be a back side illumination (BSI) image sensor. In this case, the second substrate 200 is interposed between the interconnection stack 201 and the lower bonding layer 203. The lower bonding layer 203 may result from a deposition or from a thermal oxidation of the second substrate 200.

The transfer step of FIG. 2A can advantageously be a direct bonding by putting a face to be assembled of the upper bonding layer 103 opposite to the first substrate 100 in contact on a face to be assembled of the lower bonding layer 203 opposite to the second substrate 200. The upper and lower bonding layers 103, 203 are transparent to the detection wavelength $\lambda_2$, and may furthermore be transparent to the emission wavelength $\lambda_1$. They transmit for example at least 50% of an incident light in normal incidence at the detection wavelength $\lambda_2$ and/or emission wavelength $\lambda_1$, or preferentially at least 90%, or even at least 95%.

The direct bondings implemented in the context of the invention can be of any known types. It may be a case of a direct bonding by molecular adhesion. In this case, the bonding results from chemical bonds that are established between the assembled faces. Several types of bonding by molecular adhesion exist. They differ in particular through conditions of temperature, pressure or atmosphere and/or processing steps prior to putting the faces to be assembled in contact. It may be a case, for example, of bonding at ambient temperature, hydrophilic or hydrophobic, with or without prior activation by plasma of the faces to be assembled, optionally followed by heat treatment reinforcing the bonding interface. It may be a case also of atomic fusion bonding (ADB) or of surface-activated bonding (SAB).

In the context of direct bonding during the transfer step of FIG. 2A, the upper and lower bonding layers 103, 203 may both be made from silicon oxide, silicon nitride, or amorphous silicon. The upper and lower bonding layers 103, 203 are here made from silicon oxide and each have a thickness of between 300 nm and 600 nm. Their faces to be assembled were polished prior to the transfer to obtain a roughness state compatible with direct bonding by molecular adhesion. A consolidation heat treatment of the bonding interface after putting the upper and lower bonding layers 103, 203 in contact is applied, at a temperature of between 300° C. and 400° C. At the end of the transfer step of FIG. 2A, the upper and lower bonding layers 103, 203 form a single bonding layer 303.

The lower conductive layer 102 is transparent to the detection wavelength $\lambda_2$, and may furthermore be transparent to the emission wavelength $\lambda_1$. They transmit for example at least 50% of an incident light in normal incidence at the detection wavelength $\lambda_2$ and/or emission wavelength $\lambda_1$, or preferentially at least 90%, or even at least 95%. The lower conductive layer 102 may be made from metallic oxide, for example from indium-tin oxide (ITO), from aluminum-doped zinc oxide (AZO) or from tin dioxide ($SnO_2$). In this example, the lower conductive layer 102 is made from indium-tin oxide (ITO) and has a thickness of between 40 nm and 120 nm.

Here and for the remainder of the description, an orthogonal three-dimensional direct reference frame (X, Y, Z) is defined, where the X and Y axes form a plane parallel to a main plane of the second substrate 200, where the X axis is an axis of the cutting plane of FIGS. 2A to 2K, of FIGS. 3A to 3E, and of FIGS. 4A, 4B, 5A, 5B, 5C, and where the Z axis is oriented substantially orthogonally to the main plane of the second substrate 200, from the second substrate 200 towards the interconnection stack 201 and the bonding layer 303. In the following description, the terms "vertical" and "vertically" should be understood as relating to an orientation substantially parallel to the Z axis, and the terms "horizontal" and "horizontally" as relating to an orientation substantially parallel to the plane (X, Y). Moreover, the terms "lower" and "upper" should be understood as relating to an increasing positioning on moving away from the second substrate 200 in the direction +Z. In the reference frame (X, Y, Z), a layer, a stack, or a substrate extend from an upper face as far as a lower face, both parallel to the plane (X, Y). The upper face and/or the lower face may be structured.

Figure 2B:
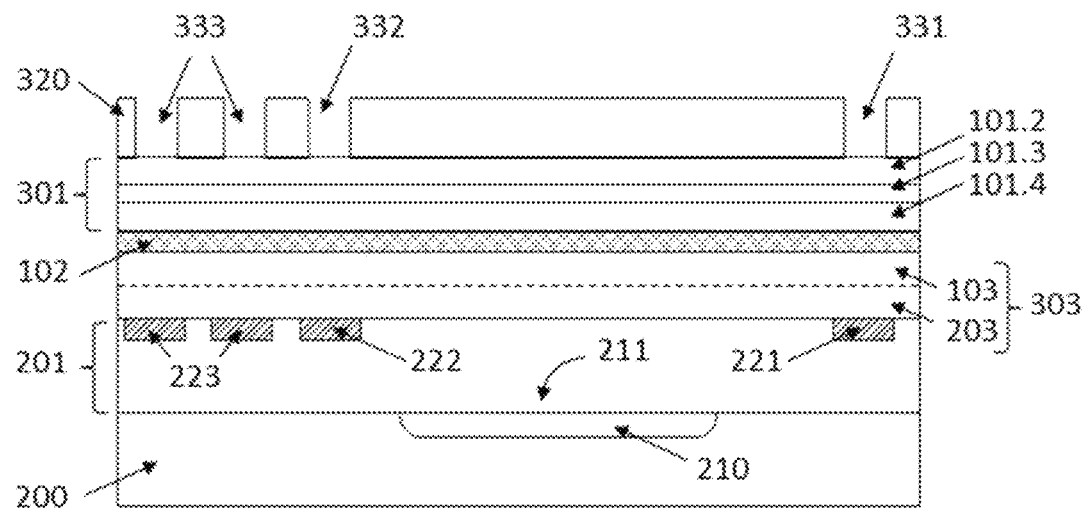

In FIG. 2B, the first substrate 100 is removed, for example, by a succession of grinding and/or polishing and/or wet etching substeps. In the particular example of FIG. 2B, the first substrate 100 made from silicon is removed by a succession of finer and finer grinding substeps, followed by selective wet chemical etching with respect to the AlN.

The optional buffer layer 101.1 is next removed to expose the n-doped layer 101.2, for example by dry etching and/or by electropolishing. At the end of the removal of the first substrate 100 and optional removal of the buffer layer 101.1 if such exists, the remaining part of the semiconductor stack 101 is a so-called active semiconductor stack 301, which has a cutoff wavelength $\lambda_c$. The active stack 301 typically has a thickness of 1 μm.

A hard mask 320 is next deposited on the n-doped layer 101.2 of the active stack 301. It may be made from silicon oxide (SiO), from silicon nitride (SiN), or from silicon oxynitride (SiON). In this particular example, it is made from silicon oxide and has a thickness of between 1 μm and 1.5 μm, for example equal to 1.2 μm.

An anode opening 331 and a cathode opening 332 are etched in the hard mask 320 vertically above, respectively, the anode bonding pad 221 and the cathode bonding pad 222, so that they pass right through the hard mask 320. It is for example possible to define the anode and cathode openings 331, 332 by a photolithography substep aligned, preferably to first order, with respect to an element of the second assembly 6, for example alignment marks positioned on the second substrate 200 or in the interconnection stack 201. Thus the position of the anode and cathode openings 331, 332 with respect to the anode and cathode bonding pads 221, 222 is precise and it is possible to reduce the horizontal dimensions of the latter. The bonding pads 221, 222, 223 typically have minimum dimensions in a plane parallel to the plane (X, Y) of between 500 nm and 5 μm, for example between 500 nm and 1 μm.

In the example in FIG. 2B, optional supplementary openings 333 are etched in the hard mask 320 vertically above a respective supplementary bonding pad 223.

The cathode opening 332 may have a loop form in a plane parallel to the plane (X, Y), for example a circular or rectangular or square loop. The anode opening 331 and the supplementary openings 333 have for example disk shapes in a plane parallel to the plane (X, Y). When the cathode opening 332 has a loop form, this surrounds the anode opening 331. Here, the cathode opening 332 has a loop form, for example square.

The openings are for example produced by reactive dry etching through an insolated resin during the photolithography substep, with stoppage on the n-doped layer 101.2. The resin can be removed by applying an oxygen plasma and a chemical solvent.

Figure 2C:
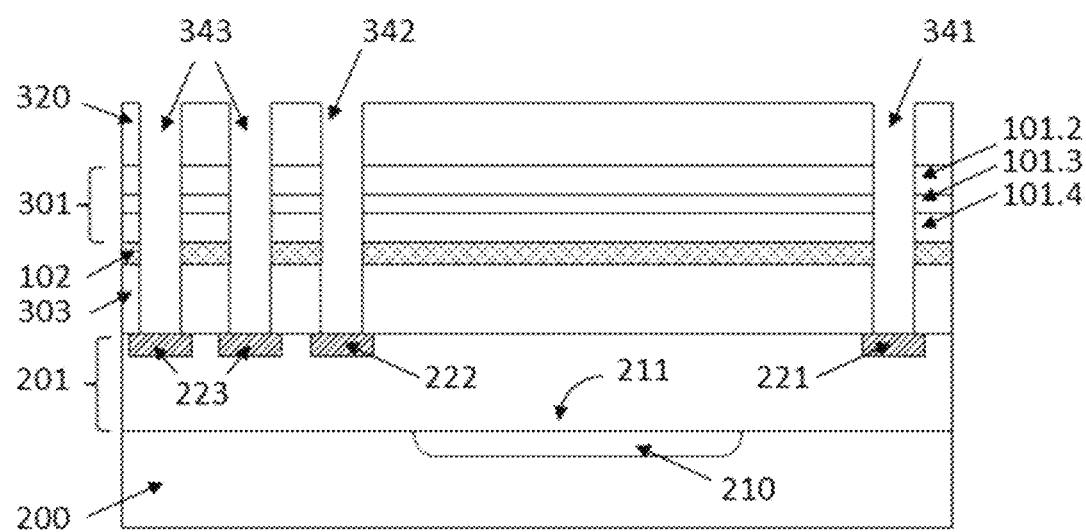

In FIG. 2C, the active stack 301, the lower conductive layer 102, the bonding layer 303, and the optional passivation layer are successively etched through anode, cathode, and supplementary openings 331, 332, 333 until they reach the bonding pads 221, 222, 223. One or more reactive dry etching substeps are for example used. The last etching substep is for example a selective etching of the passivation layer or of the bonding layer 303, with respect to the metal material of the bonding pads 221, 222, 223. A chemical cleaning can advantageously be implemented after the etching step.

At the end of the step in FIG. 2C, a first anode hole 341 is obtained facing the anode opening 331, a cathode trench 342 facing the cathode opening 332 and supplementary holes 343 facing the supplementary openings 333. The first anode hole 341 has a bottom consisting of a part of the anode bonding pad 221. Likewise, the cathode trench 342 and the supplementary holes 343 each have a bottom consisting respectively of a part of the cathode bonding pad 222 and of the supplementary bonding pads 223. Advantageously, the anode bonding pad 221, the cathode bonding pad 222 and the supplementary bonding pads 223 have forms similar respectively to the first anode hole 341, to the cathode trench 342 and to the supplementary holes 343 in a plane parallel to the plane (X, Y), with optionally a sizing difference in this plane that can absorb alignment errors during the photolithography substep. The first anode hole 341, the cathode trench 342, and the supplementary holes 343 are hereinafter collectively called through trenches 341, 342, 343.

Figure 2D:
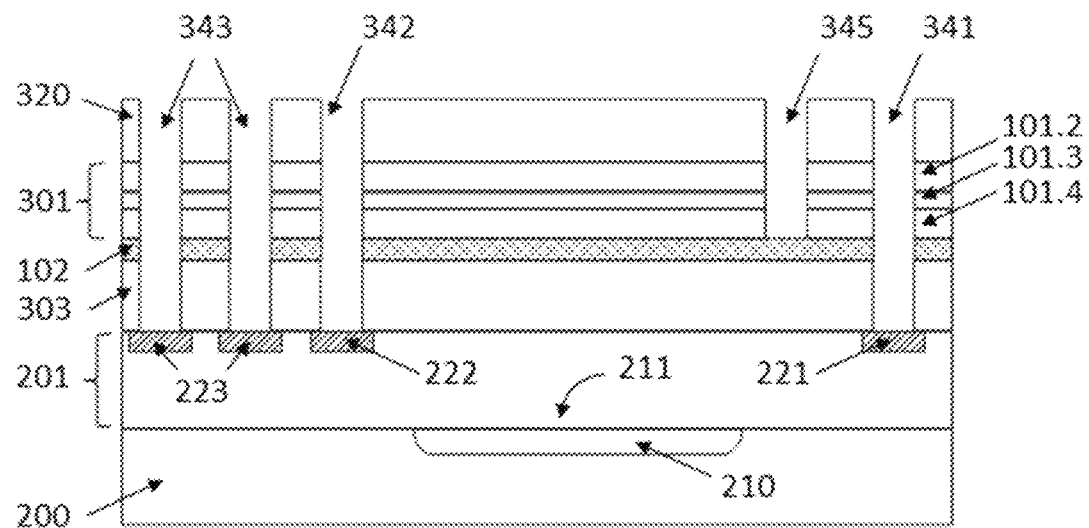

In FIG. 2D, an additional opening is etched in the hard mask 320. A second anode hole 345 is next etched in the active stack 301 through the additional opening, until it reaches the lower conductive layer 102, without going beyond it. The additional opening is for example defined by a photolithography substep aligned, preferably to first order, on an element of the second assembly 6, for example alignment marks positioned on the second substrate 200 or in the interconnection stack 201. When the active stack 301 is based on gallium nitride and the lower conductive layer 102 on indium-tin oxide (ITO), the second anode hole 345 can be etched by a $BCl_3$ plasma, selectively with respect to the indium-tin oxide (ITO). Thus it is easier to stop the etching of the second anode hole 345 on the lower conductive layer 102. The lower conductive layer 102 preferentially has a thickness greater than or equal to 100 nm to absorb a variation in thickness undergone by the active stack 301, typically less than or equal to 300 nm.

Figure 2E:
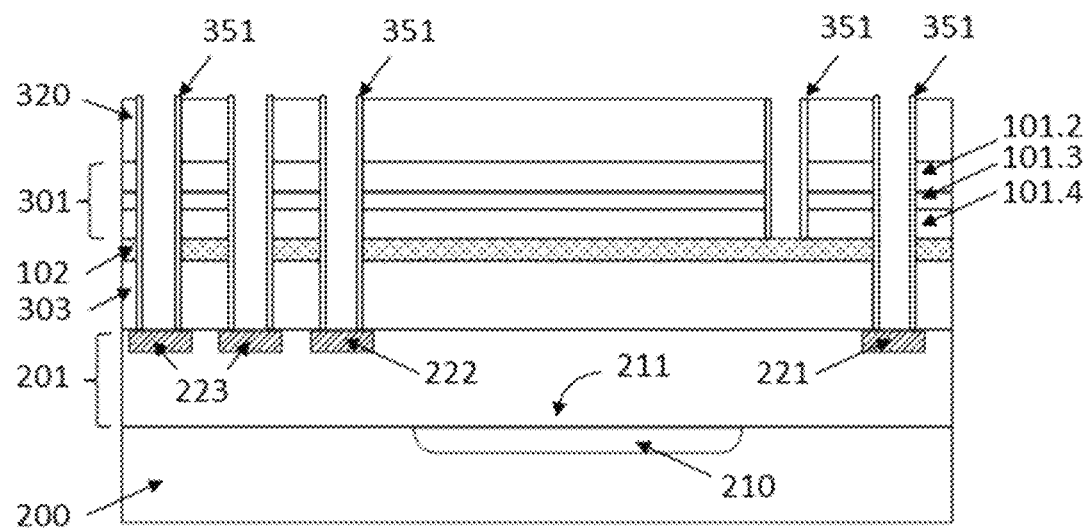

In FIG. 2E, a passivation layer is deposited conformingly directly on the hard mask 320, and on respective flanks and bottoms of the through trenches 341, 342, 343 and of the second anode hole 345. The passivation layer has substantially the same thickness on an upper face of the hard mask 320, on respective flanks and bottoms of the through trenches 341, 342, 343 and of the second anode hole 345. The variation in thickness of the passivation layer is for example less than or equal to 10%, preferentially less than 5%. Advantageously, the deposition of the passivation layer can be preceded by a chemical etching, for example based on TMAH and/or KOH.

In any cross-section parallel to the plane (X, Y) at the flanks of the through trenches 341, 342, 343 and of the second anode hole 345, the thickness of the passivation layer is such that any pair of opposite flanks is separated by two distinct parts of the passivation layer. The passivation layer may for example be made from alumina ($Al_2O_3$), from silicon nitride (SiN), or from aluminum nitride (AlN). In this example, the passivation layer is made from alumina ($Al_2O_3$) and has a thickness of between 20 nm and 100 nm.

The passivation layer is next etched anisotropically perpendicularly to the plane (X, Y), to obtain a lateral passivation layer 351. The etching can be a reactive dry etching. Preferentially, it can be followed by a chemical cleaning. During this etching substep, the part of the passivation layer in contact with the anode and cathode bonding pads 221, 222 and the supplementary bonding pads 223 is completely removed. Likewise, the part of the passivation layer in contact with the lower conductive layer 102 is completely removed. Preferably, the passivation layer is completely removed on the upper face of the hard mask 320.

Figure 2F:
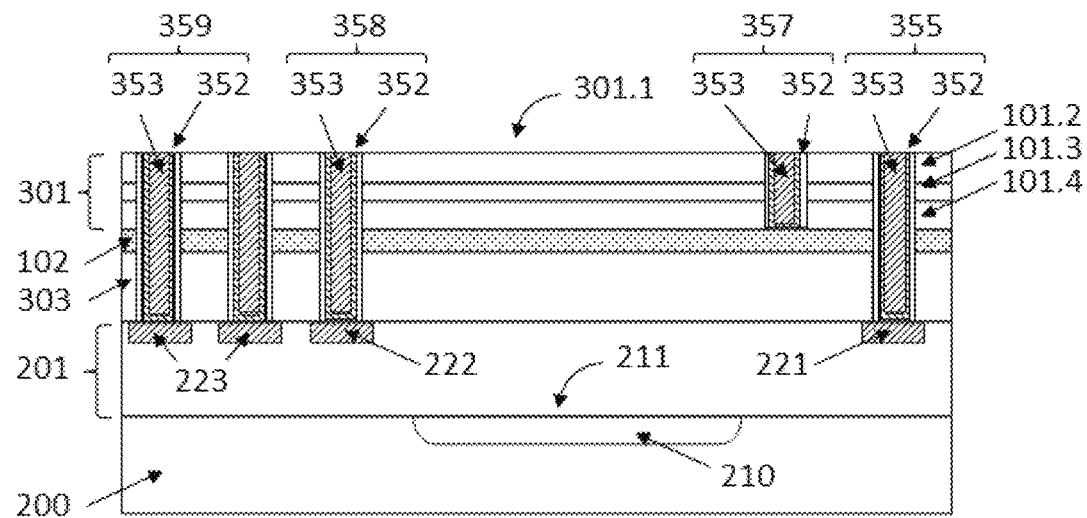

In FIG. 2F, a thin layer is deposited conformingly on the upper face of the hard mask 320, on the lateral passivation layer 351, and on respective flanks and bottoms of the through trenches 341, 342, 343 and of the second anode hole 345. In any cross-section parallel to the plane (X, Y) at the flanks of the through trenches 341, 342, 343 and of the second anode hole 345, the thicknesses of the passivation layer and of the thin layer are such that any pair of opposite flanks is separated by two distinct parts of the thin layer. The thin layer is in contact with the bonding pads 221, 222, 223 and the lower conductive layer 102. The thin layer is able to conduct electricity.

Next, the volumes defined by the thin layer inside the through trenches 341, 342, 343 and second anode hole 345 are filled, preferably completely, with a metal material. This step can for example comprise a substep of conformal deposition of a conductive seed layer, followed by a growth of a metal material by electrochemical deposition (ECD). The metal material may be copper (Cu). The seed layer may consist of a sublayer of titanium nitride (TiN) interposed between a titanium (Ti) sublayer and a copper (Cu) sublayer. The Ti sublayer is in contact with the fine sublayer and with the TiN sublayer. The Cu sublayer is in contact with the TiN layer.

Next, the part of the thin layer in contact with the hard mask 320, the part of the lateral passivation layer 351 in contact with the hard mask, the excess part of the metal material located on an upper part extending vertically from an upper face 301.1 of the active stack 301, and the hard mask 320 itself, are removed. As a result the n-doped layer 101.2 is exposed.

At the end of this removal substep, a residual part of the thin layer, a residual part of the lateral passivation layer 351, and a residual part of the metal material lie flush with the upper face 301.1 of the active stack 301. This removal substep may comprise one or more chemical mechanical polishing steps and optionally one or more cleaning steps. The substep of filling the metal material, followed by this removal substep, may comprise one or more usual bricks of a damascene method.

Advantageously, the thin layer is able to reflect a light flow at the detection wavelength $\lambda_1$, and/or at the emission wavelength $\lambda_2$. The thin layer may for example be made from aluminum (Al), from aluminum-silicon alloy (AlSi), or from copper (Cu). The thickness of the thin layer is for example equal to 80 nm at the flanks of the through trenches 341, 342, 343 and at the second anode hole 345, and equal to 300 nm on the upper face of the hard mask 320.

At the end of the step of FIG. 2F, the residual part of the thin layer constitutes a cladding 352. The residual parts of the metal material inside the through trenches 341, 342, 343 and of the second anode hole 345 each constitute a metal filling 353. Each metal filling 353 in association with a part of the cladding 352 of a corresponding through trench 341, 342, 343 constitutes an electrically conductive via 355, 359 or trench 358 in physical contact with one pad among the bonding pads 221, 222, 223. Thus an anode via 355, a conductive trench 358 and additional vias 359 are respectively housed in a first anode hole 341, the cathode trench 342 and the supplementary holes 343. The metal filling 353 in association with the part of the cladding 352 of a corresponding through trench 341, 342, 343 constitutes an electrically conductive anode contact 357 in physical contact with the lower conductive layer 102.

When the thin layer is reflective, the parts of the cladding 352 facing the flanks of the through trenches 341, 342, 343 and of the second anode hole 345 each constitute a mirror.

Figure 2G:
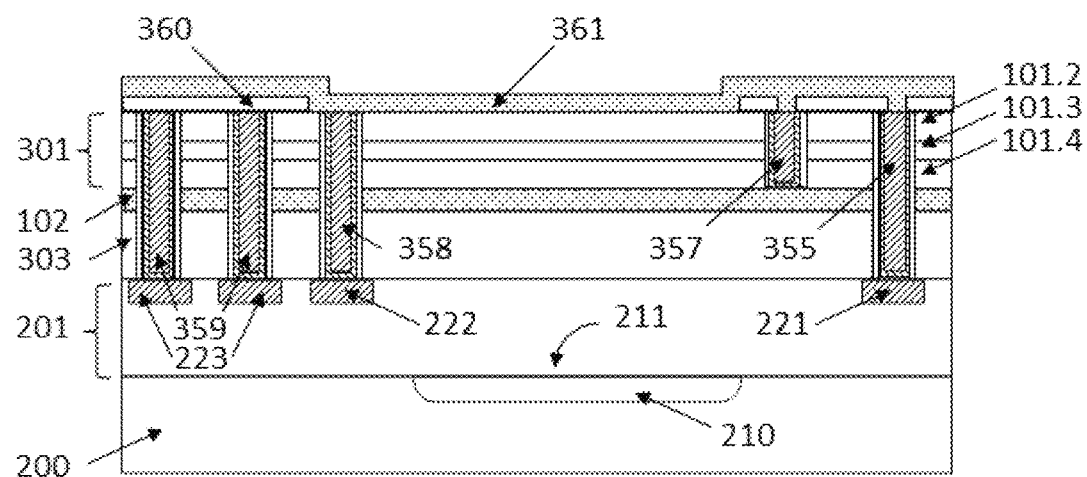

In FIG. 2G, an upper passivation layer 360 is formed on the upper face 301.1 of the active stack of 301. The upper passivation layer 360 includes openings passing right through it. A first opening is disposed facing the detection surface 211 and facing the conductive trench 358, a second opening is disposed facing the anode contact 357, and a third opening is disposed facing the anode via 355. Preferably, the first opening covers the whole of the detection surface 211. Advantageously, the first opening covers the whole of the conductive trench 358. The upper passivation layer 360 may for example be made from silicon nitride (SiN) and have a thickness of between 50 nm and 100 nm. The first, second and third openings and any supplementary openings passing right through the upper passivation layer 360 are collectively hereinafter referred to as the upper openings.

Next an upper conductive layer 361 is deposited on the upper passivation layer 360 and on a part of the n-doped layer 101.2 exposed in the upper openings. The upper conductive layer 361 is here continuous and in physical contact with the n-doped layer 101.2, the anode contact 357, and the anode via 355. It is transparent to the emission wavelength $\lambda_1$, and to the detection wavelength $\lambda_2$. They transmit for example at least 50% of an incident light in normal incidence at the emission wavelength $\lambda_1$ and detection wavelength $\lambda_2$, or preferentially at least 90%, or even at least 95%. The upper conductive layer 361 may be made from metallic oxide, for example from indium-tin oxide (ITO), from aluminum-doped zinc oxide (AZO) or from tin dioxide ($SnO_2$). In this example, the upper conductive layer 361 is made from indium-tin oxide (ITO) and has a thickness of between 60 nm and 120 nm. A thickness of between 100 nm and 120 nm makes it possible to obtain a satisfactory transmission and good electrical conductivity.

Figure 2H:
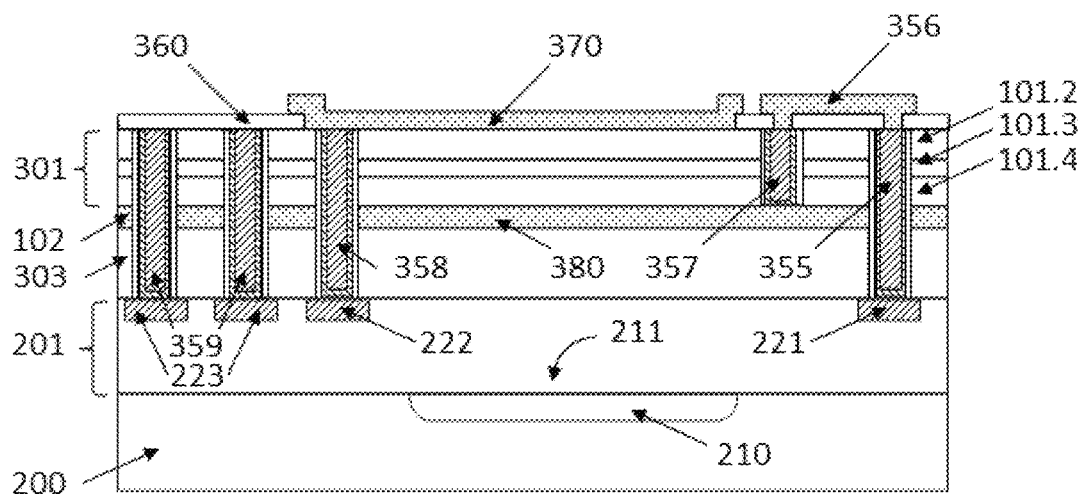

In FIG. 2H, a portion of the upper conductive layer 361 in contact with the anode contact 357 and the anode via 355 is isolated by etching to produce a conductive line 356. The conductive line 356 is electrically insulated from the n-doped layer 101.2 by the upper passivation layer 360. The upper conductive layer 361 is etched over its entire thickness, preferentially at zones entirely resting on the upper passivation layer 360.

A remaining part of the upper conductive layer 361 in contact with the n-doped layer 101.2 in the first opening constitutes a surface electrode 370 of a light-emitting diode, which is here a cathode electrode 370 of the light-emitting diode. The cathode electrode 370 is extended by a part of the upper conductive layer 361 in contact with the conductive trench 358, preferentially with the whole of an upper face of the conductive trench 358 lying flush with the upper face 301.1 of the active stack 301. Preferentially, the cathode electrode 370 covers the whole of a surface of the n-doped layer 101.2 exposed in the first opening. The part of the lower conductive layer 102 in physical contact with the anode contact 357 constitutes a buried electrode 380 of the light-emitting diode, which is here an anode electrode 380 of the light-emitting diode. A part of the cathode electrode 370, preferentially the entire cathode electrode 370, is vertically above the anode electrode 380.

The steps in FIGS. 2B to 2H lead to the formation of an active region of the light-emitting diode, arranged in the active layer 101.3. Geometries and the relative positions of the cathode electrode 370 and of the anode electrode 380 delimit horizontal dimensions of the active region. Here, the anode electrode 380 and the cathode electrode 370 are delimited by the conductive trench 358. Consequently the same applies to the active region. Thus the formation of the conductive trench 358 participates in the formation of the active region. The conductive trench 358 being aligned, preferably to first order, with respect to an element of the second assembly 6, the positioning of the active region with respect to the detection surface 211 is precise. The same applies to the positionings of the anode via 355 and of the anode contact 357 with respect to the detection surface 211 and to the interconnection stack 201.

Figure 2I:
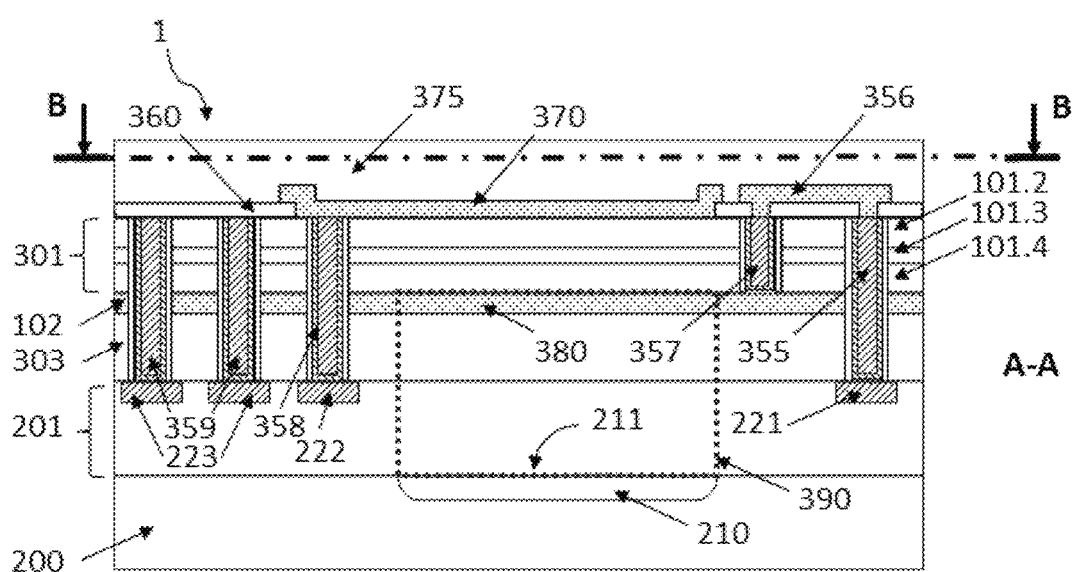
FIGS. 2I and 2J are respectively a schematic view in lateral section and a schematic view in cross section from above of the first optoelectronic device.
Figure 2J:
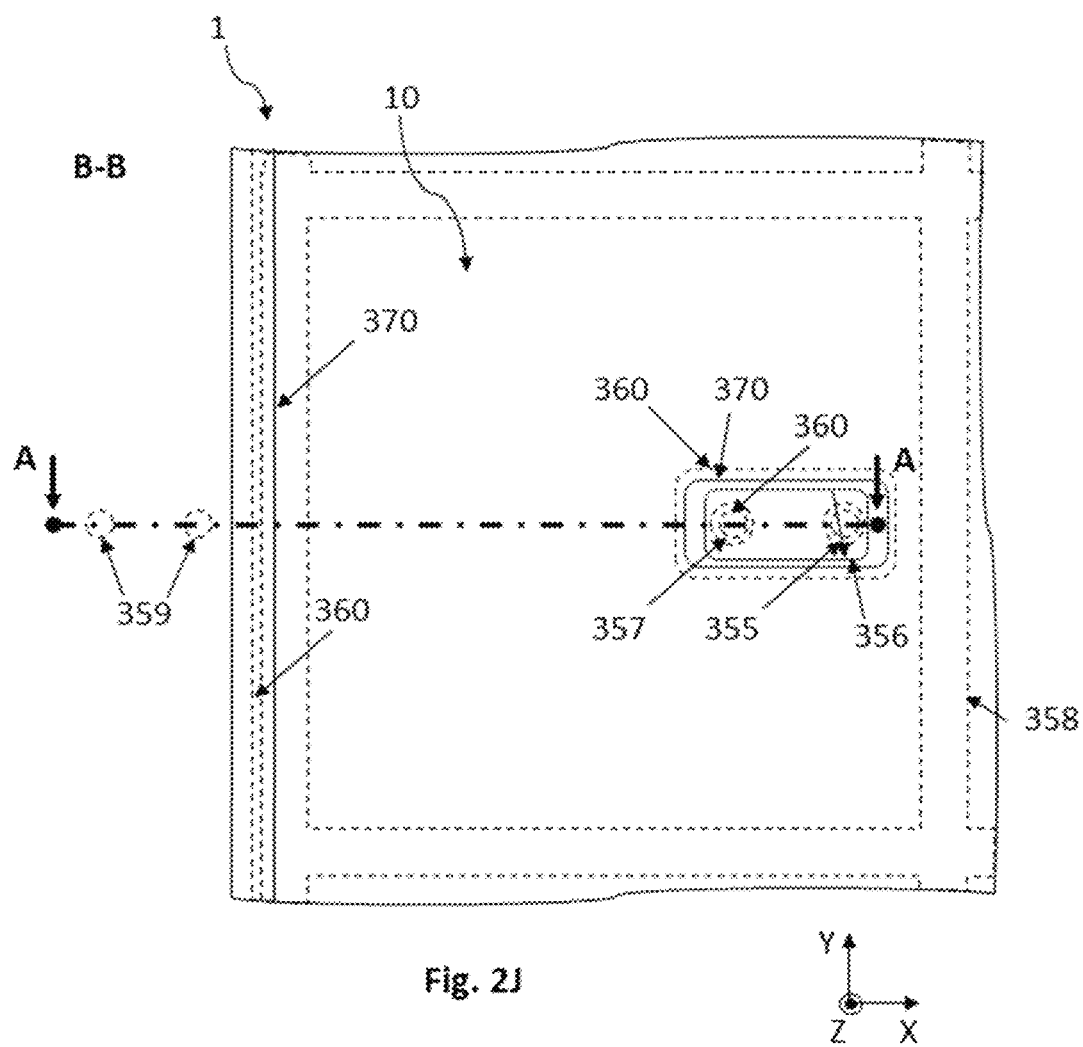

FIGS. 2I and 2J illustrate a final step of the first manufacturing method. These are views of the first embodiment of a first optoelectronic device 1 according to the invention. FIG. 2J is a plan view in cross section along the cutting plane B-B in FIG. 2I. FIG. 2I is a view in cross section along the cutting plane A-A in FIG. 2J.

During the final step, an optional encapsulation layer 375 is deposited on the upper passivation layer 360, the cathode electrode 370, and the conductive electrode 356. The encapsulation layer 375 can comprise one or more sublayers, for example made from a material selected from silicon oxide (SiO) or silicon nitride (SiN). The encapsulation layer 375 can have a planar upper face on a part opposite to the second substrate 200. The final step may comprise a substep subsequent to the depositing of the encapsulation layer 375 for thinning the second substrate 200, for example for baring vias extending in depth in the second substrate 200 from the front face of the second substrate 200.

The first optoelectronic device 1 includes a pixel 10. In the particular case of FIGS. 2I and 2J, the first optoelectronic device 1 comprises a plurality of identical pixels 10 arranged in a matrix. The matrix extends in a plane parallel to the plane (X, Y). Only one pixel 10 is shown on FIG. 2J. This is positioned on an edge of the matrix of pixels.

The pixel 10 includes a photodetector 210, a light-emitting diode, and an intermediate region 390 interposed between the photodetector 210 and the light-emitting diode. The photodetector 210 is here a photodiode, for example a pinned photodiode. An upper surface of a doped region of the photodiode delimits the detection surface 211.

The light-emitting diode comprises the anode electrode 380 and a part of the active stack 301 delimited by the cathode trench 342. The anode electrode 380 is also delimited by the cathode trench 342. The light-emitting diode furthermore includes the cathode electrode 370. The latter is delimited by the cathode trench 342 in the plane of the upper face 301.1 of the active stack 301.

The intermediate region 390 is a fictitious region that extends from the detection surface 211 as far as the active stack 301. It has a base and a wall. The base is the detection surface 211, here placed in the vicinity of the front face of the second substrate 200. The wall is parallel to the Z axis. It may be a straight prism or a straight elliptical cylinder. The intermediate region 390 includes a part passing through the interconnection stack 201, a part passing through the bonding layer 303 and a part passing through the anode electrode 380. It has no metal elements.

The first optoelectronic device 1 comprises an electrical path electrically connecting the anode electrode 380 to the control circuit. The electrical path includes the anode contact 357, the anode via 355 and the conductive line 356. The conductive line 356 is separated from the cathode electrode 370 by an insulating material that may be air or, as shown here, a part of the encapsulation layer 375. The conductive line 356 here has a substantially rectangular shape in plan view. In this example, the cathode electrode 370 surrounds the conductive line 356 in all the directions of a plane parallel to the plane (X, Y). Alternatively, the conductive line 356 can extend above the cathode trench 342, on a part insulated from the conductive trench 358 by the upper passivation layer 360. In this case, it can electrically connect an anode contact 357 of an adjacent pixel 10. Preferentially, the control circuit has connection components or connection lines arranged under the anode bonding pad 221, and/or under the anode contact 357, and/or under the conductive line 356. The components may for example be transistors or doped regions.

The conductive trenches 358 of two adjacent pixels 10 can be distinct. Alternatively, as in this particular example, the conductive trenches 358 of two adjacent pixels 10 have a part in common. Here, the conductive trench 358 of the matrix of pixels 10 forms, in plan view, a grid of orthogonal lines, delimited by external lines forming a rectangular or square frame. Each part between two adjacent interconnections of the grid constitutes the common part of the conductive trenches 358.

The cathode electrode 370 of a pixel can be electrically insulated from the cathode electrode 370 of one or more adjacent pixels. Alternatively, as shown in FIG. 2J, a plurality of pixels 10, preferentially all the pixels 10, have a common cathode electrode 370, i.e. the cathode electrode 370 of one pixel 10 is electrically connected to the cathode electrodes 370 of other pixels 10, preferentially all the pixels 10, of the matrix by portions of the upper conductive layer 361.

Now variants of the first embodiment will be described in relation to FIGS. 3A to 3E. Only the differences with respect to the first embodiment are explicitly described. These variants include additional features with respect to the first embodiment that can all be combined with each other to give rise to supplementary variants falling within the scope of the invention.

Figure 3A:
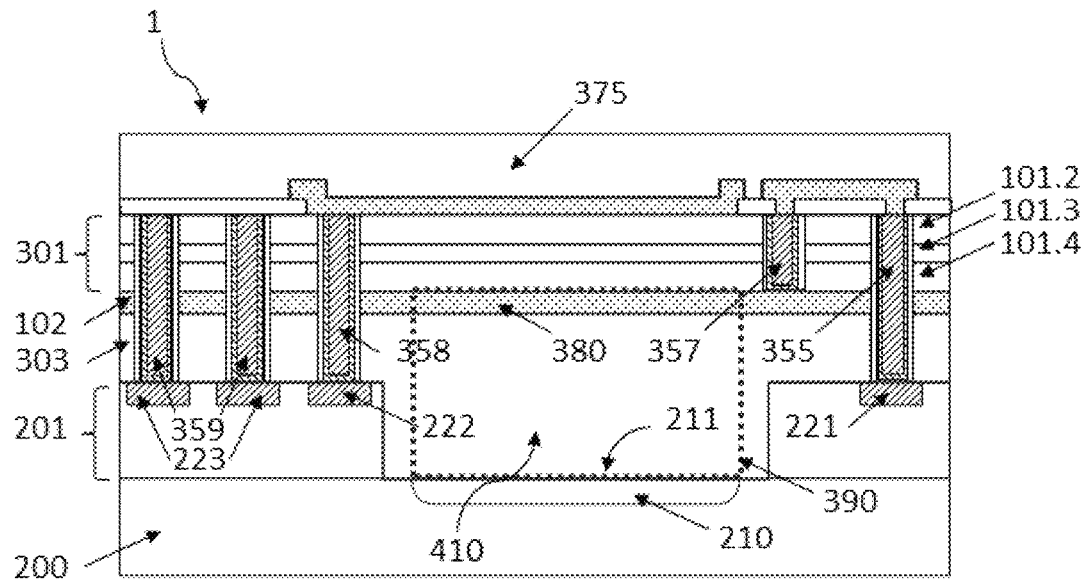
FIG. 3A is a schematic view in cross section of a first variant of the optoelectronic device according to the invention.

FIG. 3A describes a first useful variant, for example, when the region of the interconnection stack 201 facing the detection surface 211 comprises non-metallic sublayers absorbent or reflective at the emission wavelength $\lambda_1$ and/or at the detection wavelength $\lambda_2$, for example one or more sublayers of silicon nitride (SiN). In this variant, prior to the transfer step of FIG. 2A, a recess 410 has been etched in the interconnection stack 201 facing the detection surface 211 to remove parts of absorbent sublayers. The recess 410 has sufficient dimensions to eliminate all the parts of the absorbent sublayers vertically above the detection surface 211. Preferentially, as shown here, the recess 410 passes right through the interconnection stack 201. Advantageously, the whole of the detection surface 211 is facing the recess 410.

The lower bonding layer 203 is a layer deposited subsequently to the etching of the recess 410, completely filling the recess 410. It is for example possible to deposit a dielectric layer, for example a silicon oxide (SiO) with a thickness strictly greater than a depth in the direction Z of the recess 410, followed by a polishing, for example a chemical mechanical polishing (CMP).

Figure 3B:
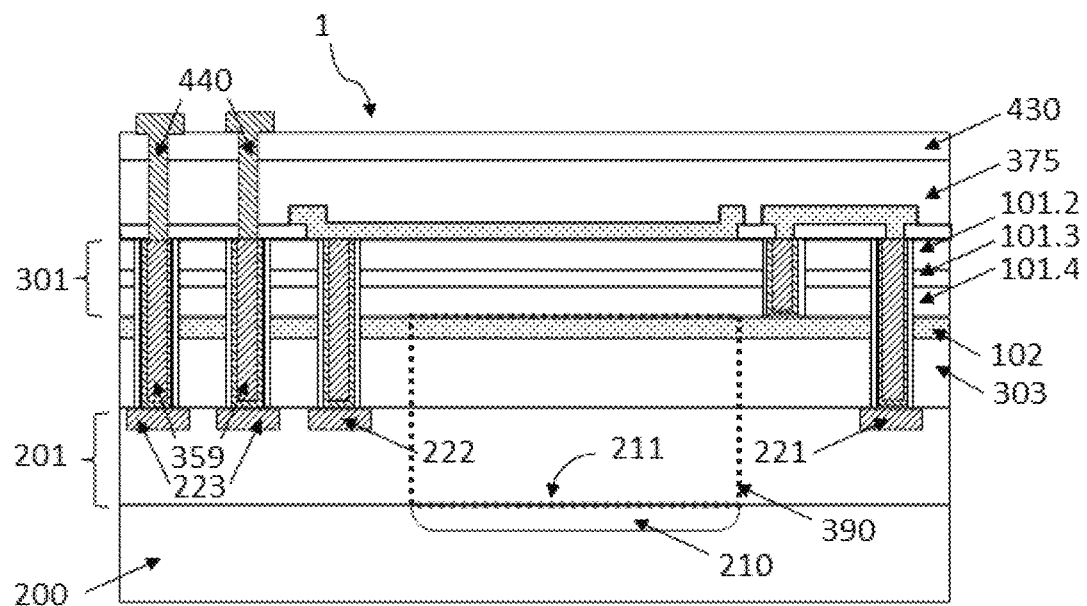
FIG. 3B is a schematic view in cross section of a second variant of the optoelectronic device according to the invention.

FIG. 3B describes a second variant incorporating a surface layer 430 with an optical function. The surface layer 430 with an optical function is a layer deposited on the encapsulation layer 375 at the end of the step of FIG. 2I.

The surface layer 430 with an optical function may for example be an antireflection layer 430 configured to obtain an antireflection function at the emission wavelength $\lambda_1$, and/or at the detection wavelength $\lambda_2$. The antireflection layer 430 may be a single layer or comprise a plurality of sublayers. The material and the thickness of the layer or the materials and the thicknesses of the sublayers are selected, for example by simulation, to obtain the required antireflection function.

For example, the antireflection layer 430 may be made from silicon nitride (SiN). It may have a thickness of between 50 nm and 65 nm, or between 175 nm and 190 nm, or between 295 nm and 310 nm, to obtain an antireflection function at an emission wavelength $\lambda_1$ of 365 nm, for an active stack 301 of gallium nitride (GaN), an upper conductive layer 361 of indium-tin oxide (ITO) 100 nm thick, and an encapsulation layer 375 of silicon oxide (SiO). In combination with a thickness of the encapsulation layer 375 of less than 200 nm, the transmission of a light flow emitted by the light-emitting diode from the upper face 301.1 of the active stack 301 is greater than 90%. The three ranges of thickness of the above antireflection layer 430 of silicon nitride (SiN) in combination respectively with ranges of thickness of the encapsulation layer 375 of between 100 nm and 150 nm, or between 140 nm and 170 nm, or between 50 nm and 150 nm, make it possible to furthermore obtain a degree of transmission of an incident light flow on the antireflection layer 430 in the active stack 301 greater than 90% at a detection wavelength $\lambda_2$ of 630 nm.

The surface layer 430 with an optical function may be a surface layer absorbent at the emission wavelength $\lambda_1$. The absorbent surface layer has a through opening (not shown on FIG. 3B) facing the active region of the light-emitting diode and extends over a surface of the encapsulation layer 375 facing a region between two adjacent pixels 10. In this particular example, it also extends over a surface of the encapsulation layer 375 facing the conductive line 356. Thus a light flow emitted by a light-emitting diode of a pixel 10 guided by the encapsulation layer 375 is attenuated, and a crosstalk phenomenon can be avoided.

In FIG. 3B, optional pads 440 are shown. The pads 440 pass right through the encapsulation layer 375 vertically above a corresponding additional via 359. The pads 440 are made from an electrically conductive material. In the presence of a surface layer 430 with an optical function, as shown here, they can pass right through it or be arranged in a through opening formed in the surface layer 430 with an optical function. The pads 440 may be in any number greater than or equal to 1. When the first optoelectronic device 1 includes a matrix of pixels 10, they can be arranged in a peripheral part of the matrix of pixels 10. This may for example be pads 440 serving for the electrical testing of the first optoelectronic device 1, for example before individualization of the first optoelectronic device 1 by cutting a second substrate 200 including a plurality of first optoelectronic devices 1.

Figure 3C:
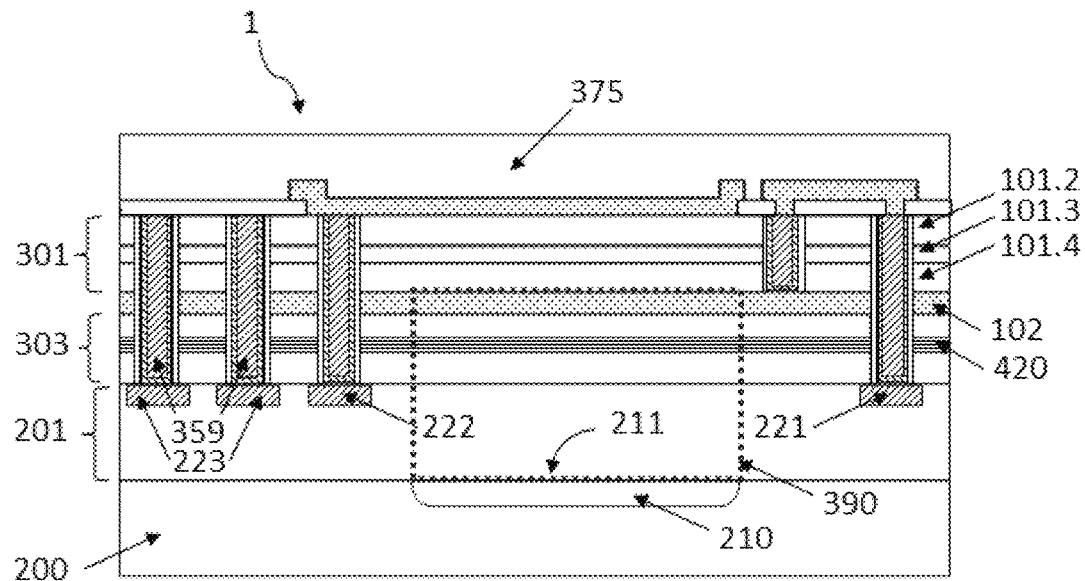
FIG. 3C is a schematic view in cross section of a third variant of the optoelectronic device according to the invention.
Figure 3C:
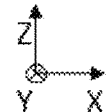

FIG. 3C describes a third variant incorporating an intermediate layer 420 with an optical function in the bonding layer 303. The intermediate layer 420 with an optical function is a sublayer of the upper bonding layer 103 or of the lower bonding layer 203, or the intermediate layer 420 with an optical function may result from the combination of sublayers in the upper and lower bonding layers 103, 203. The third variant can be advantageous when the photodetector 210 is both sensitive to the emission wavelength $\lambda_1$ and to the detection wavelength $\lambda_2$ and is intended to operate at the same time as the light-emitting diode. The photodetector 210 is thus not dazzled by the light-emitting diode.

The detection surface 211 of at least one pixel 10, preferentially all the pixels 10, is entirely facing the intermediate layer 420 with an optical function, i.e. the intermediate region 390 comprises at least a part of the intermediate layer 420 with an optical function. When the intermediate layer 420 with an optical function is integrated in the lower bonding layer 203, it is possible to etch openings passing through the intermediate layer 420 with an optical function vertically above the detection surface 211 of some pixels 10.

The intermediate layer 420 with an optical function may be an interference filter. The interference filter may for example be configured to increase a ratio of a transmission of a light flow at the detection wavelength $\lambda_2$ to a transmission of a light flow at the emission wavelength $\lambda_1$. For an emission wavelength $\lambda_1$ lying in the UVA range and a detection wavelength $\lambda_2$ lying in the visible spectrum, the intermediate layer 420 with an optical function may comprise an alternation of sublayers of silicon nitride (SiN) and of silicon oxide (SiO), for example nine SiN/SiO bilayers, the thickness of the sublayers of silicon nitride (SiN) may for example be equal to 44 nm and the thickness of the sublayers of silicon oxide (SiO) may for example be 62 nm.

The intermediate layer 420 with an optical function may be a reflective layer. The reflective layer may for example be a quarter-wave plate independent of the polarization of the light, for example at the emission wavelength $\lambda_1$. Thus a ratio of the transmission of a light flow at the detection wavelength $\lambda_2$ to the transmission of a light flow at the emission wavelength $\lambda_1$ is increased. The quarter-wave plate may be made from amorphous silicon. Where applicable, the quarter-wave plate may result from the assembly of upper and lower bonding layers 103, 203 comprising amorphous silicon on their faces to be assembled during an atomic diffusion bonding (ADB). The quarter-wave plate of amorphous silicon may for example have a thickness of 19.2 nm.

The intermediate layer 420 with an optical function may be an absorbent layer, for example of amorphous silicon with a thickness of 100 nm.

Figure 3D:
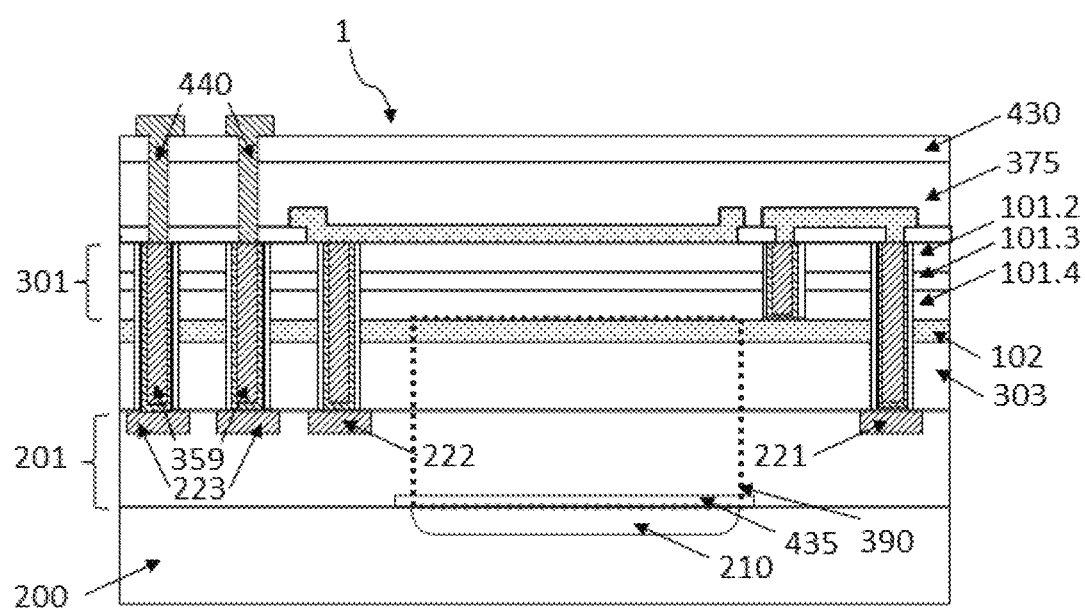
FIG. 3D is a schematic view in cross section of a fourth variant of the optoelectronic device according to the invention.
Figure 3D:
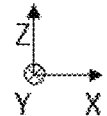

FIG. 3D describes a fourth variant repeating the features of the variant of FIG. 3B and furthermore including an antireflection window 435 arranged facing the detection surface 211. The intermediate region 390 comprises the antireflection window 435. The antireflection window 435 is for example in contact with the front face of the second substrate 200. It has a layer with an optical function that has an antireflection function at the detection wavelength $\lambda_2$. It may for example be a structured layer of tantalum oxide ($Ta_2O_5$), of alumina ($Al_2O_3$), of silicon nitride (SiN), or of titanium oxide ($TiO_2$). For a detection wavelength $\lambda_2$ of 630 nm, a photodiode made from silicon (Si) passivated by a layer of alumina ($Al_2O_3$) 15 nm thick interposed between the antireflection window 435 and the photodiode and in contact with these, the antireflection window 435 may for example be made from tantalum oxide ($Ta_2O_5$) and have a thickness greater than 70 nm, for example equal to 105 nm. It may also be made from silicon nitride (SiN) and have a thickness of between 410 nm and 430 nm.

Figure 3E:
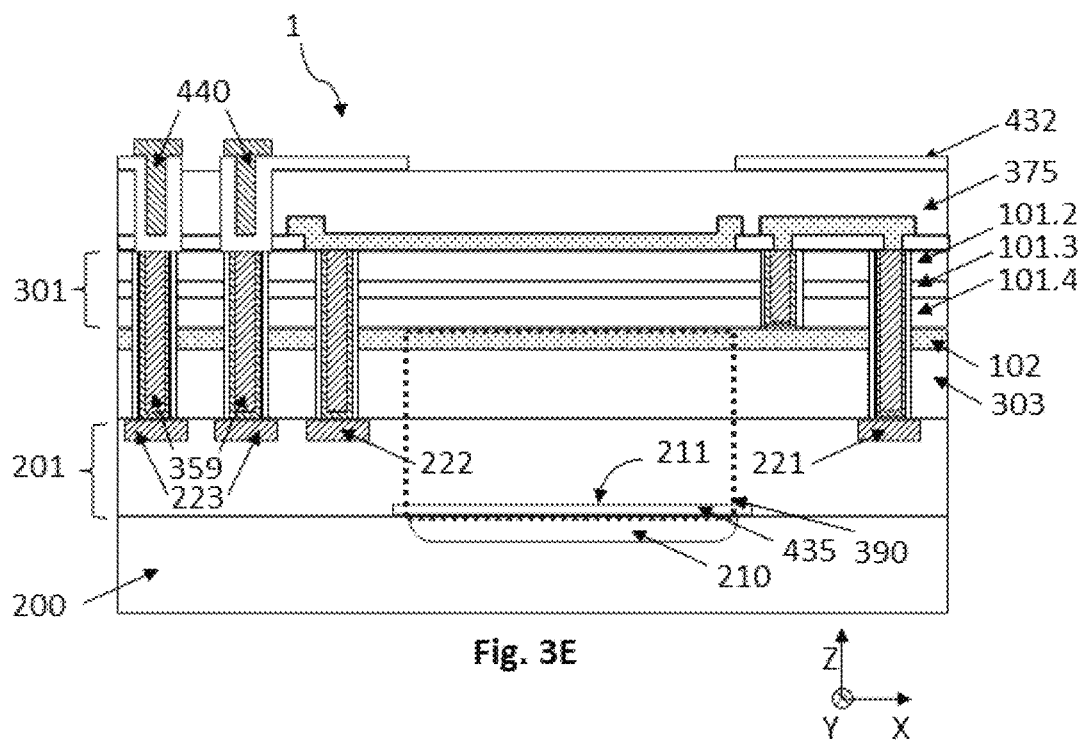
FIG. 3E is a schematic view in cross section of a fifth variant of the optoelectronic device according to the invention.

FIG. 3E describes a fifth variant incorporating the antireflection window 435 introduced at FIG. 3D and a heating element 432. The antireflection window 435 is here optional.

For this variant, at the end of the step of FIG. 2I, a through opening is etched through the encapsulation layer 375 facing a additional via 359. A supplementary conductive layer made from electrically conductive material is next deposited conformingly in a bottom and on a flank of the opening and on the upper face of the encapsulation layer 375. The supplementary conductive layer is in contact with the additional via 359 and extends continuously from the additional via 359 towards the upper face of the encapsulation layer 375. It is next etched over its entire thickness facing the active region of the light-emitting diode to obtain the heating element 432.

The heating element 432 has a through opening facing the active region of the light-emitting diode and, preferentially extends over a surface of the encapsulation layer 375 facing a region between two adjacent pixels 10. In this particular example, it also extends over a surface of the encapsulation layer 375 facing the conductive line 356.

The heating element 432 is capable of heating up by Joule effect when traversed by an electric current passing through the additional via 359. The electric current can be controlled by the control circuit, for example to stabilize a surface temperature of the first optoelectronic device 1 or to implement a thermal cycle. It is for example capable of heating up to a temperature of 55° C. The heating element 432 may furthermore fulfil the function of the absorbent surface layer of FIG. 3B.

The supplementary conductive layer may for example be made from titanium nitride (TiN), thus making it possible to fulfil both the function of heating by Joule effect and the reduction of crosstalk. It may for example have a thickness of 100 nm.

Optionally, the heating element 432 may be electrically connected to a pad 440 by a part of the supplementary conductive layer extending the heating element in an opening etched in the encapsulation layer 375 and the upper passivation layer 360, as shown in FIG. 3E.

A variant of the first method leading to a sixth variant of the first optoelectronic device 1 will now be described in relation to FIGS. 4A and 4B. Only the differences with respect to the first embodiment and to the first device are explained. The variant of the first optoelectronic device 1 illustrated in FIG. 4B here repeats the additional and optional features of the second variant in FIG. 3B. It is possible to combine them with one or more features from all the features described in relation to the other variants.

Figure 4A:
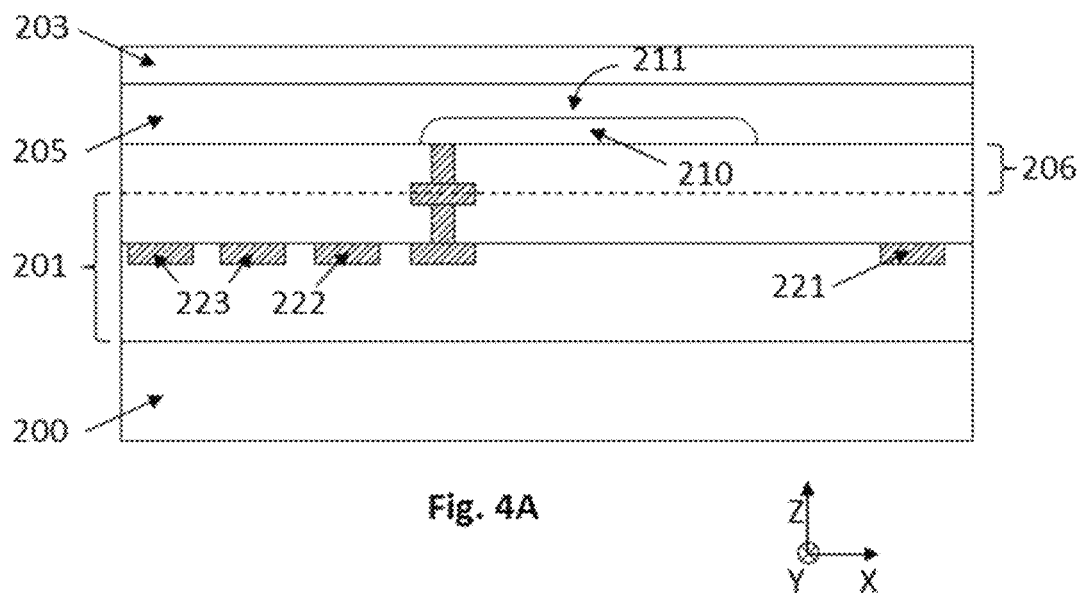
FIG. 4A is a schematic view in cross section of a variant of the second assembly.
Figure 4B:
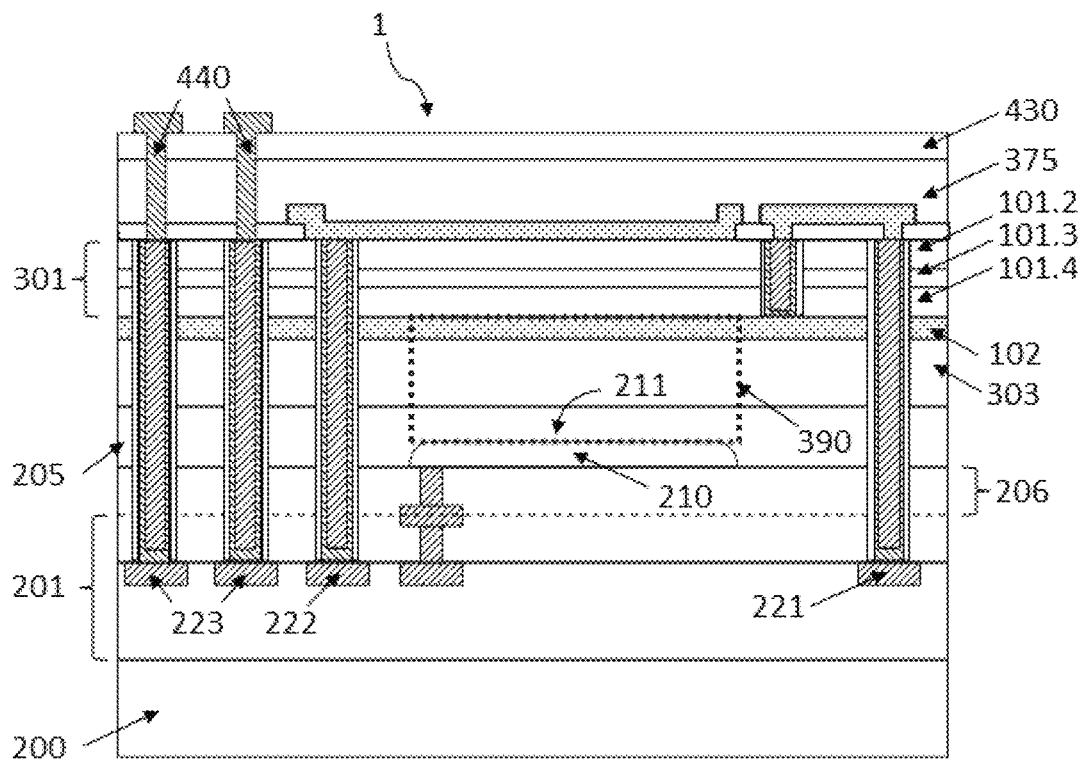
FIG. 4B is a schematic view in cross section of a sixth variant of the first optoelectronic device obtained at the end of the first manufacturing method applied to the variant of the second assembly.

The transfer step of FIG. 2A is implemented with the second assembly 6 in FIG. 4A. The photodetector 210 is here at least partly integrated in and/or on a third substrate 205. The third substrate 205 includes a supplementary interconnection stack 206 in contact with a front face of the third substrate 205. The photodetector 210 is here a photodiode lying flush with the front face of the third substrate 205. The third substrate 205 is transferred onto the interconnection stack 201, for example by metal-oxide hybrid bonding of the supplementary interconnection stack 206 on the interconnection stack 201, as shown here. The intermediate region 390 extends from the photodiode to the active stack 301 and comprises a part of the third substrate 205, a part of the bonding layer 303, and a part of the lower conductive layer 102. It has a base and a wall. The base is the detection surface 211, here placed in the third substrate 205. The wall is parallel to the Z axis. It may be a straight prism or a straight elliptical cylinder. The intermediate region 390 is devoid of metal.

The third substrate 205 preferentially has dimensions identical to the dimensions of the second substrate 200 in a plane parallel to the plane (X, Y). It may be made from a material identical to or different from the material of the second substrate 200. The material of the third substrate 205 may for example be silicon (Si), germanium (Ge), or a gallium-indium arsenide (InGaAs).

At the step of FIG. 2B, the formation of the anode opening 331 and of the cathode opening 332 may comprise a substep of aligned photolithography, preferably to first order, on an element of the second assembly 6, for example alignment marks arranged on the front face of the second substrate 200, in the interconnection stack 201, in the supplementary interconnection stack 206, or on the front face of the third substrate 205.

At the step of FIG. 2C, the through trenches 341, 342, 343 are extended through the third substrate 205 and supplementary interconnection stack 206 as far as the bonding pads 221, 222, 223.

A second manufacturing method leading to a second optoelectronic device 2 will now be described in relation to FIGS. 5A to 5D. Only the differences with respect to the first method and to the first device are described. It is possible to combine one or more features from all the features described in relation to the variants of the first optoelectronic device 1 with this embodiment.

For this second method, the steps of FIGS. 2A to 2E of the first method are first of all implemented.

Figure 5A:
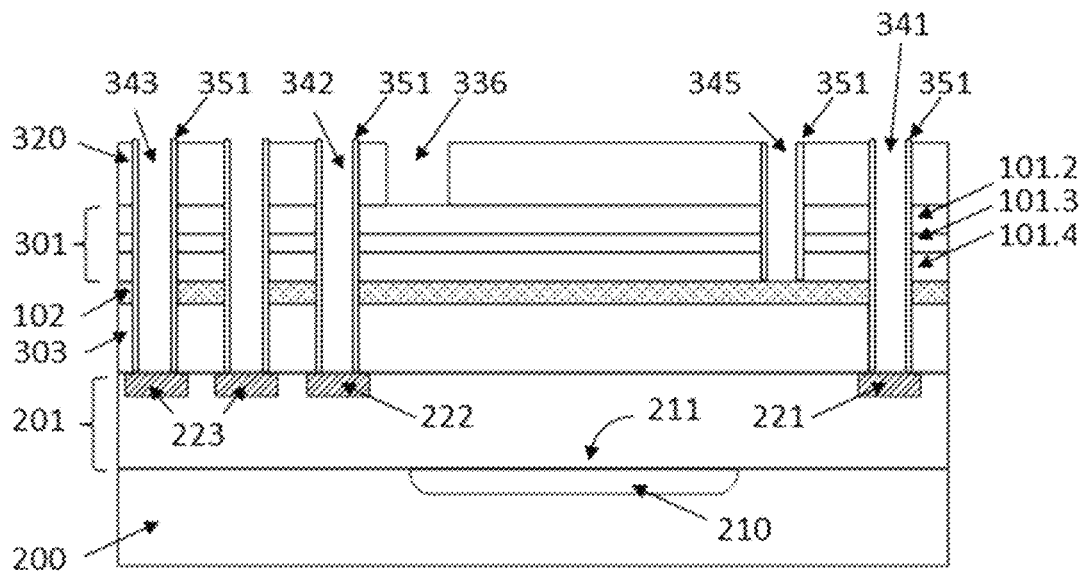
FIGS. 5A and 5B are schematic views in cross section of intermediate steps of a second method for manufacturing a second optoelectronic device according to the invention.

In FIG. 5A, a supplementary cathode opening 336 is etched in the hard mask 320. The supplementary cathode opening 336 passes right through the hard mask 320 and exposes an upper part of the n-doped layer 101.2. The supplementary cathode opening 336 is arranged with respect to the second anode hole 345 so that an imaginary line going from one to the other has a part facing the detection surface 211. When the cathode trench 342 has a loop form in a plane parallel to the plane (X, Y), the supplementary cathode opening 336 is arranged in a region surrounded by the cathode trench 342, as is the case here. Independently of the form of the cathode trench 342, the supplementary cathode opening 336 may have a loop form in a plane parallel to the plane (X, Y), as is the case in this example. Where applicable, it may for example have, in the plane, an elliptical, circular, rectangular, or, as here, square shape. In the case of an n-doped layer 101.2 of gallium nitride (GaN), a loop form of the supplementary cathode opening 336 is advantageous for a large pixel 10, for example with a size greater than 50 μm, or even 100 μm.

Figure 5B:
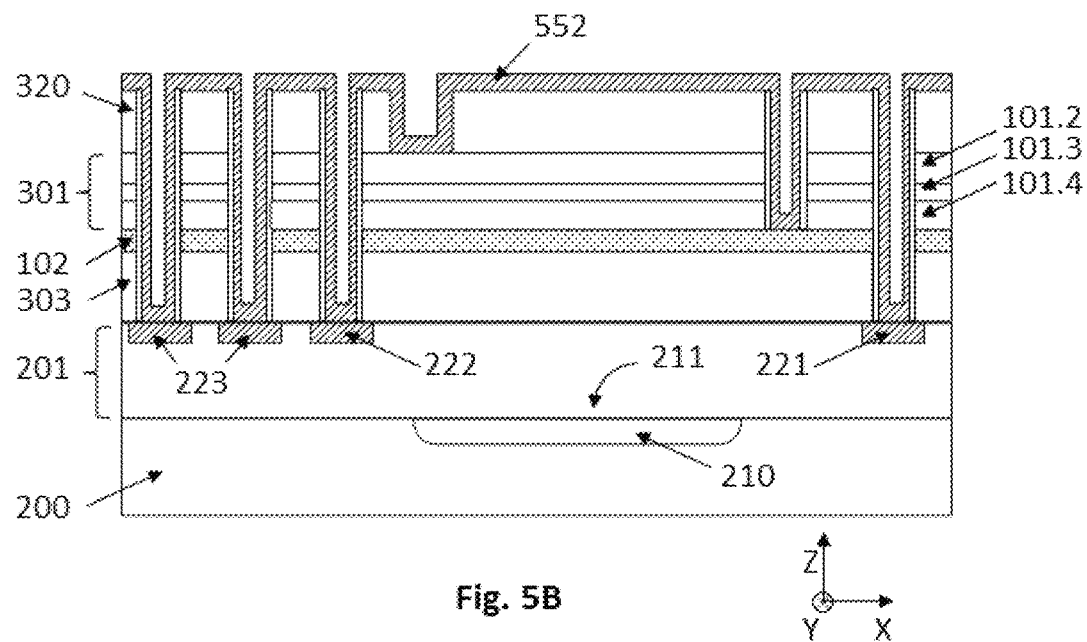

In FIG. 5B, a conductive layer 552 is deposited conformingly on an upper face of the hard mask 320, on the lateral passivation layer 351, on the bottoms of the through trenches 341, 342, 343, in contact with the bonding pads 221, 222, 223, and in the supplementary cathode opening 336, in contact with the n-doped layer 101.2. The conductive layer 552 is capable of conducting electricity. Advantageously, it is made from a metal. Preferentially, it is reflective to the emission wavelength $\lambda_1$, and/or to the detection wavelength $\lambda_2$.

The conductive layer 552 can be made from aluminum (Al), from aluminum-silicon alloy (AlSi), from aluminum-copper alloy (AlCu), from tungsten (W), or from titanium (Ti).

Figure 5C:
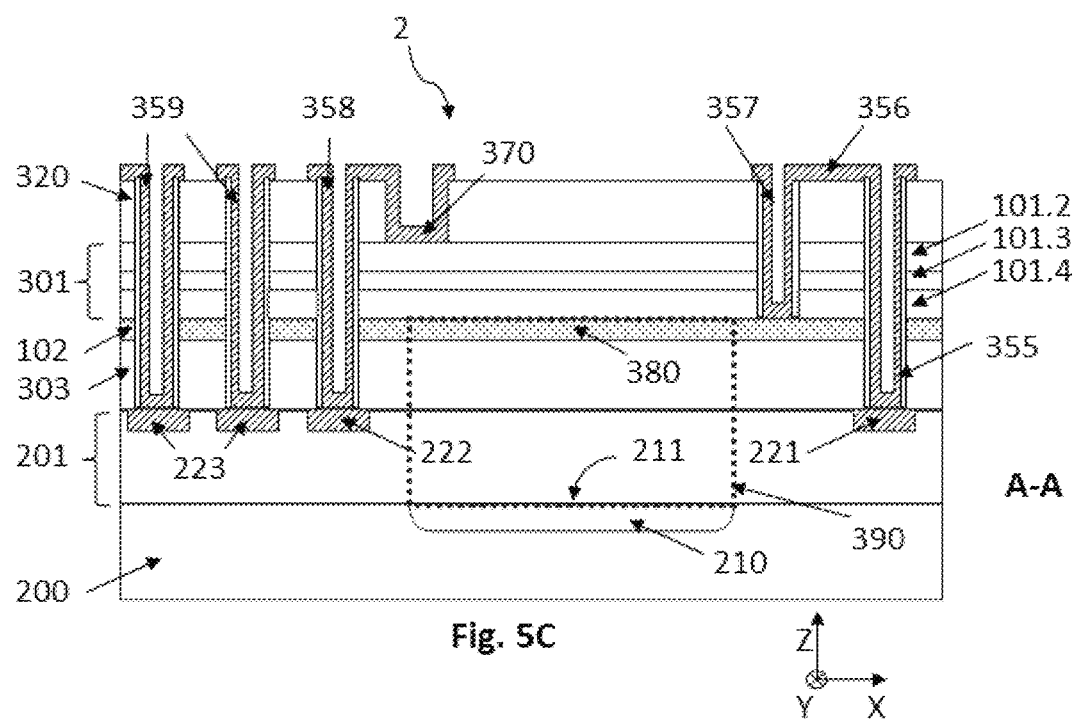
FIGS. 5C and 5D are respectively a schematic view in lateral section and a schematic view from above of a second optoelectronic device resulting from the second manufacturing method.

In FIG. 5C, the conductive layer 552 is etched right through to isolate a conductive line 356, in contact with the upper face of the hard mask 320, from a surface electrode 370, in contact with the exposed part of the n-doped layer 101.2. The surface electrode is here a cathode electrode 370. The conductive line 356 and the cathode electrode 370 are two distinct parts of the conductive layer 552 isolated by the etching. The cathode electrode 370 is by definition restricted to the part of the conductive layer 552 in contact with the n-doped layer 101.2 in the supplementary cathode opening 336. At the end of this step, the conductive line 356 is extended as an anode contact 357 consisting of a part of the conductive layer 552 in contact with the lower conductive layer 102, arranged in the second anode hole 345. It is also extended as an anode via 355 consisting of a part of the conductive layer 552 in contact with the anode bonding pad 221, arranged in the first anode hole 341. The cathode electrode 370 is extended as a conductive trench 358 consisting of a part of the conductive layer 552 in contact with the cathode bonding pad 222, arranged in the cathode trench 342. The conductive line 356, the anode contact 357 and the anode via 355 constitute together an electrical path electrically connecting the control circuit to the anode electrode 380. The electrical path is electrically isolated from the active stack 301 by the hard mask 320 and the lateral passivation layer 351.

Figure 5D:
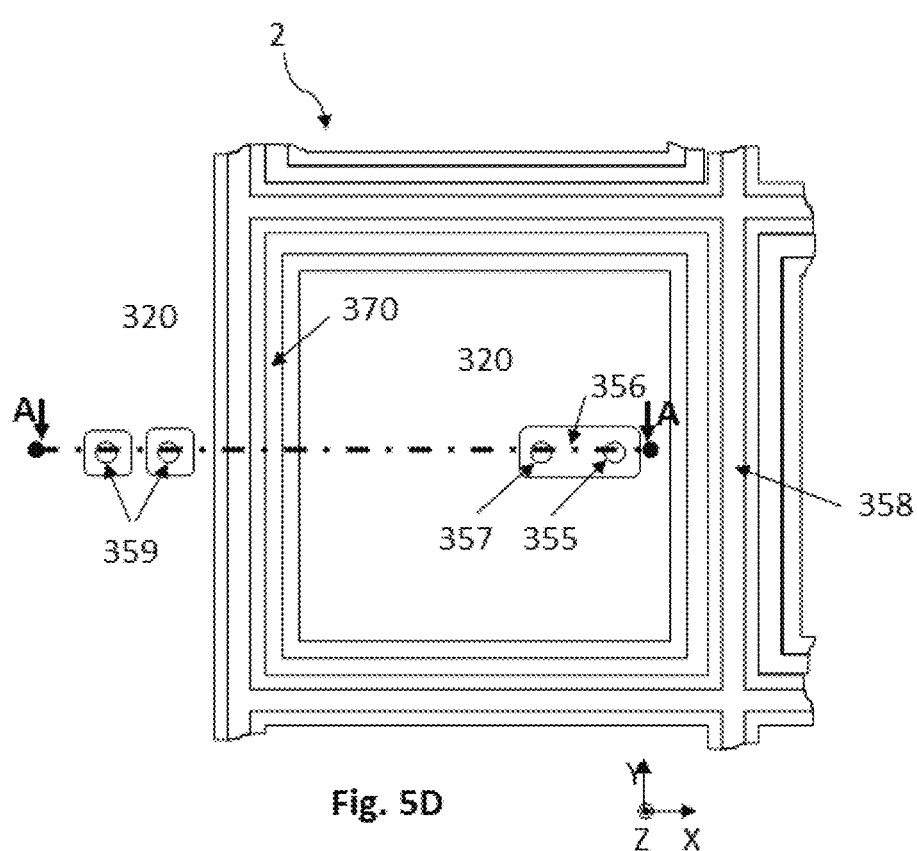

The conductive line 356 here has a substantially rectangular shape in plan view (FIG. 5D). Still in this example, it is surrounded by the cathode electrode 370, which is itself surrounded by the conductive trench 358.

In the case where the second optoelectronic device 2 includes pads 440, these can rest on parts of the conductive layer 552 resting on the upper face of the hard mask 320, electrically isolated from the conductive line 356, from the cathode electrode 370, from the anode via 355, from the anode contact 357, and from the conductive trench 358 by the etching. The encapsulation layer 375 can fill empty spaces in the through trenches 341, 342, 343, the supplementary cathode opening 336, and the second anode hole 345, where applicable.

Particular embodiments have just been described. Different variants and modifications will appear to a person skilled in the art. It is for example within the capability of a person skilled in the art to use a layer of organic blue 303 when transferring the first assembly 5 onto the second assembly 6, example a layer of silicone or a layer of polyimide.

The invention claimed is:

1. An optoelectronic device, comprising:
    a substrate;
    a control circuit integrated in and/or on the substrate comprising an interconnection stack;
    a matrix of one pixel or more, each pixel comprising a photodetector, a light-emitting diode, and an intermediate region interposed between the photodetector and the light-emitting diode, and each pixel being such that:
        the photodetector is sensitive to a detection wavelength $\lambda_2$ and comprises a detection surface extending in a plane substantially parallel to a main plane of the substrate;
        the light-emitting diode comprises:
            an active stack with a cutoff wavelength $\lambda_c$ shorter than the detection wavelength $\lambda_2$ comprising first and second doped layers of opposite types,
            a buried electrode in contact with the second doped layer,
            the light-emitting diode being arranged so that the buried electrode is interposed between the interconnection stack and the active stack, and covers the detection surface, and so that:
        the intermediate region is delimited by the detection surface and extends from the detection surface as far as the active stack,
    the optoelectronic device wherein it further comprises:
        a via passing entirely through the active stack and extending up to an interconnection level of the interconnection stack;
        an electrical contact passing entirely through the active stack, in contact with the buried electrode;
        an electrical path electrically connecting the buried electrode to the control circuit and comprising the electrical through-contact and the via;
    and in that:
        the intermediate region is devoid of metal,
        the buried electrode is transparent to the detection wavelength $\lambda_2$.

2. The optoelectronic device according to claim 1, such that, for each pixel, the light-emitting diode comprises:
    an active region extending between the first and second doped layers in a plane substantially parallel to the main plane;
    a conductive trench surrounding the active region and the intermediate region, passing entirely through the active stack and extending up to an interconnection level of the interconnection stack; and
    a surface electrode in contact with the first doped layer, electrically connected to the control circuit by the conductive trench.

3. The optoelectronic device according to claim 2, wherein the conductive trench is coated with a mirror.

4. The optoelectronic device according to claim 2, wherein the matrix comprises a plurality of pixels, and the surface electrode is an electrode common to all the pixels.

5. The optoelectronic device according to claim 4, wherein the conductive trenches of two adjacent pixels have a part in common.

6. The optoelectronic device according to claim 1, wherein the intermediate region comprises an intermediate layer with an optical function extending parallel to the main plane of the substrate.

7. The optoelectronic device according to claim 1, wherein, for each pixel, the buried electrode is made from an indium-tin oxide, from a zinc oxide doped with aluminum, or from tin dioxide.

8. The optoelectronic device according to claim 2, wherein, for each pixel, the surface electrode is made from an indium-tin oxide, from a zinc oxide doped with aluminum, or from tin dioxide.

9. The optoelectronic device according to claim 1, further comprising a surface layer with an optical function disposed on a face of the optoelectronic device opposite to the substrate.

10. The optoelectronic device according to claim 9, wherein the surface layer with an optical function is an absorbing layer comprising an opening facing the detection surface.

11. The optoelectronic device according to claim 1, further comprising a heating element arranged on a face of the optoelectronic device opposite to the substrate, the heating element comprising an opening facing the detection surface.

12. The optoelectronic device according to claim 1, wherein the detection wavelength $\lambda_2$ belongs to the visible spectrum and the light-emitting diode is configured to emit a light flow in the UVA range.

13. A method for manufacturing an optoelectronic device, comprising a light-emitting diode and a photodetector sensitive to a detection wavelength $\lambda_2$, the method comprising the following steps:
    providing a first assembly comprising, in the following order, a first substrate, a semiconductor stack, and a lower conductive layer, such that the semiconductor stack comprises a first doped layer of a first type of conductivity and a second doped layer of a second type of conductivity opposite to the first type of conductivity, interposed between the first doped layer and the first substrate, and such that the lower conductive layer is in physical contact with the second doped layer, providing of a second assembly comprising a second substrate, a control circuit, and the photodetector, such that the control circuit is integrated in and/or on the second substrate and comprises an interconnection stack, bringing a face of the first assembly opposite to the first substrate onto a face of the second assembly opposite to the second substrate by direct bonding, implementing a bonding layer transparent to the detection wavelength $\lambda_2$, exposing the first doped layer comprising removing the first substrate, to obtain an active stack comprising the first doped layer and the second doped layer, etching a first hole implementing an alignment of the first hole with respect to an element of the second assembly, so that the first hole passes entirely through the active stack and extends up to an interconnection level of the interconnection stack, etching a second hole implementing an alignment of the second hole with respect to an element of the second assembly, so that the second hole passes entirely through the active stack with stoppage on the lower conductive layer, passivating the first hole and the second hole to obtain, respectively, a first passivated hole and a second passivated hole, filling the first and the second passivated holes with a metal to obtain, respectively, a via and an electrical contact, forming a conductive line electrically insulated from the active stack and in contact with the electrical contact and the via, forming an active region of the light-emitting diode in the active stack facing a detection surface of the photodetector, after the bonding step, implementing an alignment of the active region with respect to an element of the second assembly.

14. The method according to claim 13, for which the step of forming the active region comprises a sub-step of etching a trench passing entirely through the active stack and extending up to an interconnection level of the interconnection stack.

15. The method according to claim 13, for which the bonding layer comprises an intermediate layer with an optical function.

\* \* \* \* \*